(12) United States Patent
Chung et al.

(10) Patent No.: US 10,403,699 B2
(45) Date of Patent: Sep. 3, 2019

(54) TRANSPARENT DISPLAY DEVICE AND METHOD OF MANUFACTURING A TRANSPARENT DISPLAY DEVICE

(71) Applicant: Samsung Display Co., Ltd., Yongin-Si, Gyeonggi-Do (KR)

(72) Inventors: Jin-Koo Chung, Suwon-si (KR); Jeong-Woo Moon, Suwon-si (KR); Byoung-Hee Park, Seoul (KR); Jun-Ho Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/101,149

(22) Filed: Aug. 10, 2018

(65) Prior Publication Data

US 2019/0006446 A1 Jan. 3, 2019

Related U.S. Application Data

(62) Division of application No. 15/447,798, filed on Mar. 2, 2017, now Pat. No. 10,074,705.

(30) Foreign Application Priority Data

May 16, 2016 (KR) .......................... 10-2016-0059528

(51) Int. Cl.
*H01L 27/12* (2006.01)
*H01L 27/32* (2006.01)
*H01L 51/52* (2006.01)

(52) U.S. Cl.
CPC ........ *H01L 27/3258* (2013.01); *H01L 27/124* (2013.01); *H01L 27/1248* (2013.01); *H01L 27/1288* (2013.01); *H01L 27/326* (2013.01); *H01L 27/3216* (2013.01); *H01L 27/3276* (2013.01); *H01L 51/5253* (2013.01); *H01L 27/3244* (2013.01); *H01L 2227/323* (2013.01)

(58) Field of Classification Search
None
See application file for complete search history.

(56) References Cited

U.S. PATENT DOCUMENTS

| 2012/0313099 | A1 | 12/2012 | Chung et al. |
| 2013/0161656 | A1 | 6/2013 | Choi et al. |
| 2016/0043154 | A1 | 2/2016 | Choi et al. |
| 2017/0229529 | A1* | 8/2017 | Jung ................... H01L 27/3258 |

FOREIGN PATENT DOCUMENTS

| KR | 10-2013-0073721 A | 7/2013 |
| KR | 10-2015-0019332 A | 2/2015 |

* cited by examiner

*Primary Examiner* — Thien F Tran
(74) *Attorney, Agent, or Firm* — Innovation Counsel LLP

(57) ABSTRACT

In a method of manufacturing a transparent display device, a substrate including a pixel region and a transmission region may be provided. A first electrode may be formed on the substrate in the pixel region, and a display layer may be formed on the first electrode. A second electrode facing the first electrode may be formed on the display layer, and a capping structure including a first capping layer and a second capping layer may be formed on the second electrode. The first capping layer may be formed on the second electrode in the pixel region and a first region of the transmission region by using a mask that has an opening, the mask may be shifted, and the second capping layer may be formed on the second electrode in the pixel region and a second region of the transmission region by using the shifted mask.

2 Claims, 33 Drawing Sheets

TRANSPARENT DISPLAY DEVICE AND METHOD OF MANUFACTURING A TRANSPARENT DISPLAY DEVICE

CROSS-REFERENCE TO RELATED APPLICATION(S)

This application is a divisional application of U.S. patent application Ser. No. 15/447,798 filed on Mar. 2, 2017, which claims priority under 35 USC § 119 to Korean Patent Application No. 10-2016-0059528, filed on May 16, 2016 in the Korean Intellectual Property Office (KIPO), the entire disclosure of which is incorporated by reference herein.

BACKGROUND

1. Field

Example embodiments relate generally to display devices. More specifically, example embodiments relate to transparent display devices and methods of manufacturing the transparent display devices.

2. Description of the Related Art

Recently, a display device (e.g., an organic light-emitting display (OLED) device) having transparent or light-transmitting properties has been developed.

To manufacture a transparent display device, various variables (e.g., a composition, a disposition, a thickness, etc.) of components (e.g., substrates, electrodes, insulation layers, etc.) of the transparent display device, and their various advantages and disadvantages, may be addressed. For example, the OLED device may include a stack of insulation layers that contain different materials. In this case, the insulation layers may cause optical characteristics (e.g., transmittance) of the OLED device to be unsatisfactory.

SUMMARY

Example embodiments provide methods of manufacturing transparent display devices with reduced manufacturing time and cost.

Example embodiments provide transparent display devices with improved light transmittance and luminescent efficiency.

According to an aspect of example embodiments, in a method of manufacturing a transparent display device, a substrate may be provided, the substrate including a pixel region and a transmission region. A first electrode may be formed over the substrate in the pixel region, and a display layer may be formed on the first electrode. A second electrode may be formed on the display layer to face the first electrode. A capping structure may be formed on the second electrode, the capping structure including a first capping layer and a second capping layer. The first capping layer may be formed on the second electrode in the pixel region and a first region of the transmission region, by using a mask that has an opening. The mask may then be shifted. The second capping layer may be formed on the second electrode in the pixel region and a second region of the transmission region by using the shifted mask.

In example embodiments, a width of the opening may be substantially equal to the sum of a width of the pixel region and a half of a width of the transmission region. An end portion of the first region may be adjacent to an end portion of the second region in the transmission region. The capping structure may have a first thickness in the pixel region and may have a second thickness substantially less than the first thickness in the transmission region.

In some example embodiments, a width of the opening may be substantially greater than the sum of a width of the pixel region and a half of a width of the transmission region and substantially less than the sum of the width of the pixel region and the width of the transmission region. The transmission region may further include a third region in which the first region overlaps the second region. The capping structure may have a first thickness in the pixel region and the third region of the transmission region and may have a second thickness substantially less than the first thickness in a remaining region of the transmission region, the remaining region being outside the third region.

In some example embodiments, a width of the opening may be substantially greater than a width of the pixel region, and substantially less than the sum of the width of the pixel region and a half of a width of the transmission region. The transmission region may further include a third region positioned between the first region and the second region. The capping structure may have a first thickness in the pixel region and may have a second thickness in the first region and the second region, wherein the second thickness is less than the first thickness.

In example embodiments, an aperture may be formed in the second electrode. The aperture may overlap at least a portion of the transmission region.

According to an aspect of example embodiments, in a method of manufacturing a transparent display device, a substrate may be provided, the substrate including a first pixel region, a first transmission region, a second pixel region, and a second transmission region. A first electrode may be formed over the substrate in each of the first pixel region and the second pixel region, and a display layer may be formed on the first electrode. A second electrode may be formed on the display layer to face the first electrode. A capping structure may be formed on the second electrode, the capping structure including a first capping layer and a second capping layer. The first capping layer may be formed on the second electrode in the first pixel region, the first transmission region, and the second pixel region by using a mask that has an opening. The mask may then be shifted. The second capping layer may be formed on the second electrode in the first pixel region, the second pixel region, and a second transmission region by using the shifted mask.

In example embodiments, a width of the opening may be substantially equal to the sum of a width of the first pixel region, a width of the first transmission region, and a width of the second pixel region. The capping structure may have a first thickness in the first pixel region and the second pixel region and may have a second thickness less than the first thickness in the first transmission region and the second transmission region.

According to another aspect of example embodiments, a transparent display device may include a substrate including a pixel region and a transmission region which are arranged along a first direction, a first electrode disposed over the substrate in the pixel region, a display layer disposed on the first electrode, a second electrode facing the first electrode and disposed on the display layer, and a capping structure disposed on the second electrode. The capping structure may include a first capping layer disposed on the second electrode in the pixel region and a first region of the transmission region and a second capping layer disposed on the second electrode in the pixel region and a second region of the transmission region.

In example embodiments, an end portion of the first region may be adjacent to an end portion of the second region in the transmission region. The capping structure may have a first thickness in the pixel region, and may have a second thickness less than the first thickness in the transmission region.

In some example embodiments, the transmission region may further include a third region in which the first region overlaps the second region. The capping structure may have a first thickness in the pixel region and the third region of the transmission region and may have a second thickness less than the first thickness in a remaining region of the transmission region, the remaining region being outside the third region.

In some example embodiments, the transmission region may further include a third region positioned between the first region and the second region. The capping structure may have a first thickness in the pixel region and may have a second thickness less than the first thickness in the first region and the second region.

In example embodiments, a thickness of the first capping layer may be substantially equal to a thickness of the second capping layer.

In example embodiments, the transparent display device may further include a plurality of unit pixels each including one of the pixel regions and one of the transmission regions, the plurality of unit pixels being arranged along a second direction perpendicular to the first direction. The capping structure may be provided in at least one unit pixel of the plurality of unit pixels.

In example embodiments, the capping structure may extend across more than one unit pixel of the plurality of unit pixels. In some example embodiments, a plurality of the capping structures may be provided, and ones of the capping structures may be provided separately in respective ones of the unit pixels.

In example embodiments, the pixel region may include a red sub-pixel region, a green sub-pixel region, and a blue sub-pixel region which are arranged along a second direction perpendicular to the first direction.

In example embodiments, the second electrode may include an aperture overlapping at least a portion of the transmission region.

According to another aspect of example embodiments, a transparent display device may include a substrate including a first pixel region, a first transmission region, a second pixel region, and a second transmission region, a first electrode disposed over the substrate in each of the first pixel region and the second pixel region, a display layer disposed on the first electrode, a second electrode facing the first electrode and disposed on the display layer, and a capping structure disposed on the second electrode. The capping structure may include a first capping layer disposed on the second electrode in the first pixel region, the first transmission region, and the second pixel region and a second capping layer disposed on the second electrode in the first pixel region, the second pixel region, and the second transmission region.

In example embodiments, the capping structure may have a first thickness in the first pixel region and the second pixel region, and may have a second thickness less than the first thickness in the first transmission region and the second transmission region.

According to example embodiments, in methods of manufacturing a transparent display device, a first capping layer and a second capping layer which have substantially the same area may be formed by shifting one mask, so that a resulting capping structure that has substantially different thicknesses in the pixel region and the transmission region may be formed. According to example embodiments, the transparent display device may include the capping structure that has substantially different thicknesses in the pixel region and the transmission region, so that light transmittance and luminescent efficiency of the transparent display device may be improved.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Hereinafter, transparent display devices and methods of manufacturing the transparent display devices in accordance with example embodiments will be explained in detail with reference to the accompanying drawings. The various figures are not necessarily to scale. All numerical values are approximate, and may vary. All examples of specific materials and compositions are to be taken as nonlimiting and exemplary only. Other suitable materials and compositions may be used instead.

Figure 1:
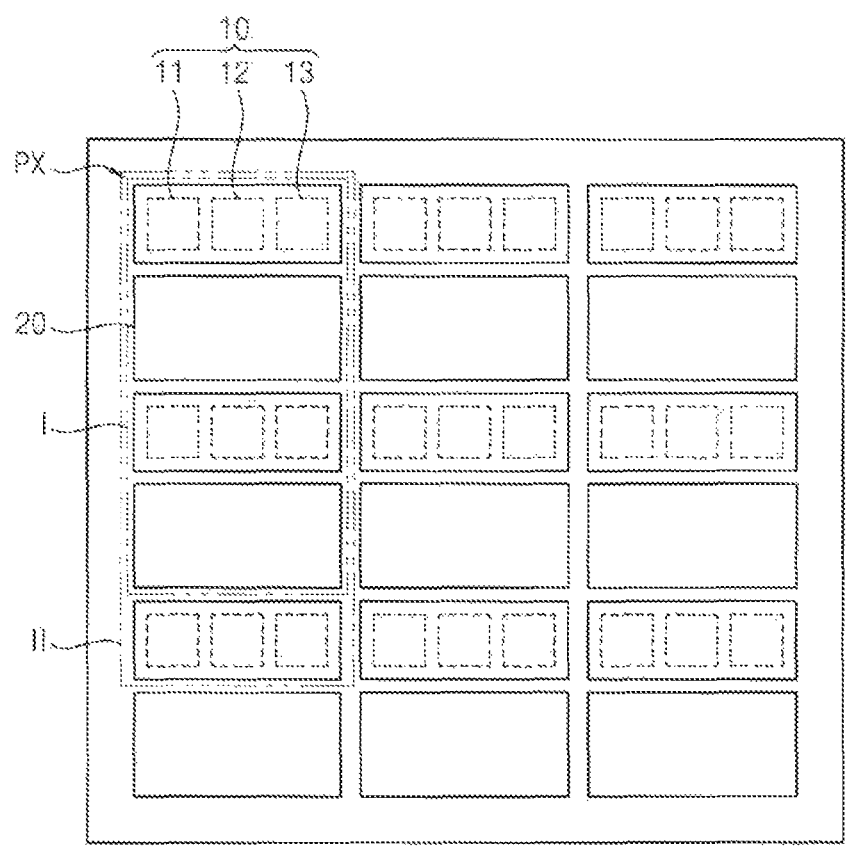
FIG. 1 is a plan view illustrating a transparent display device in accordance with example embodiments.
Figure 2:
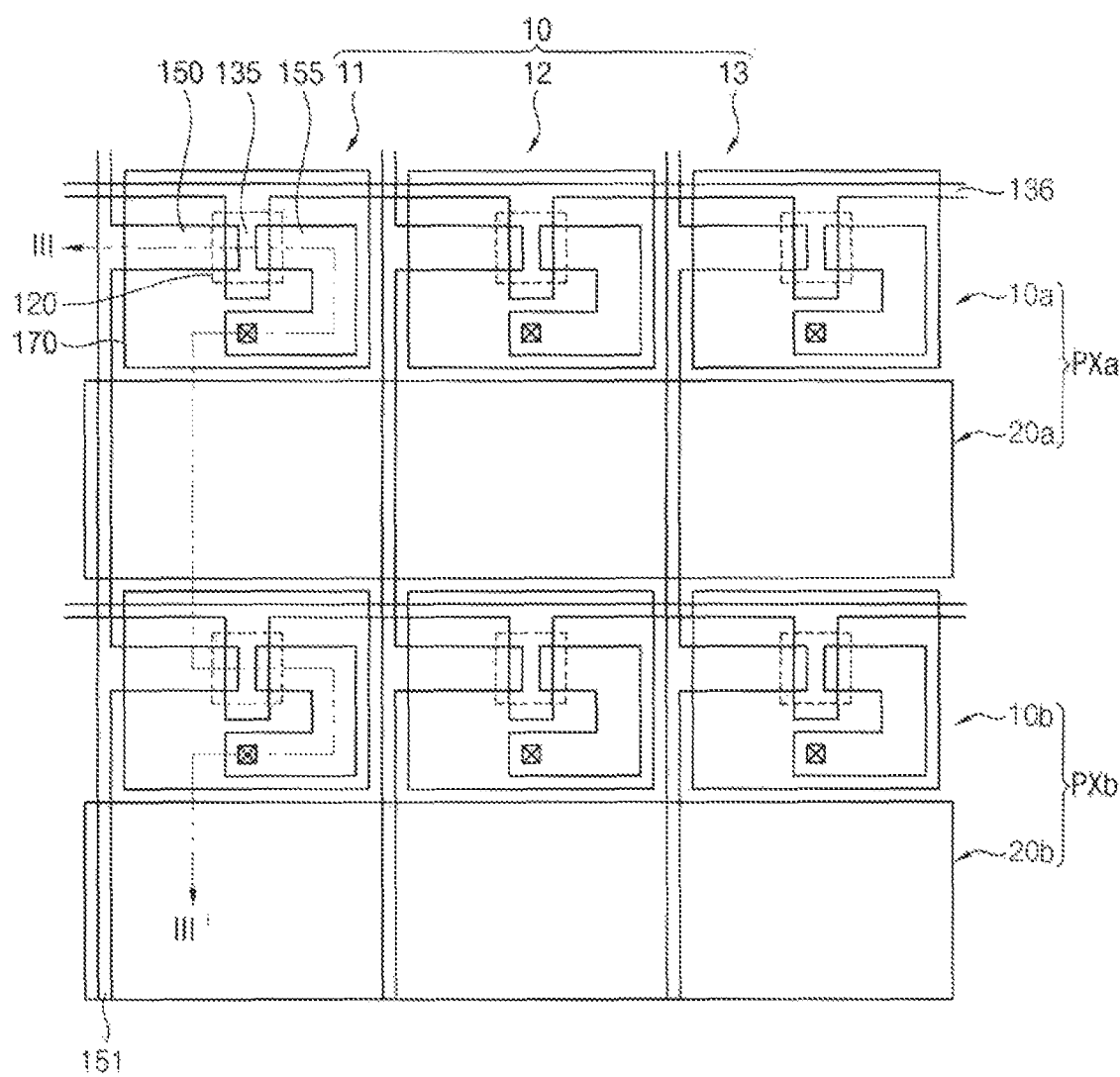
FIG. 2 is a plan view illustrating further details of an area I of the transparent display device in FIG. 1.
Figure 3:
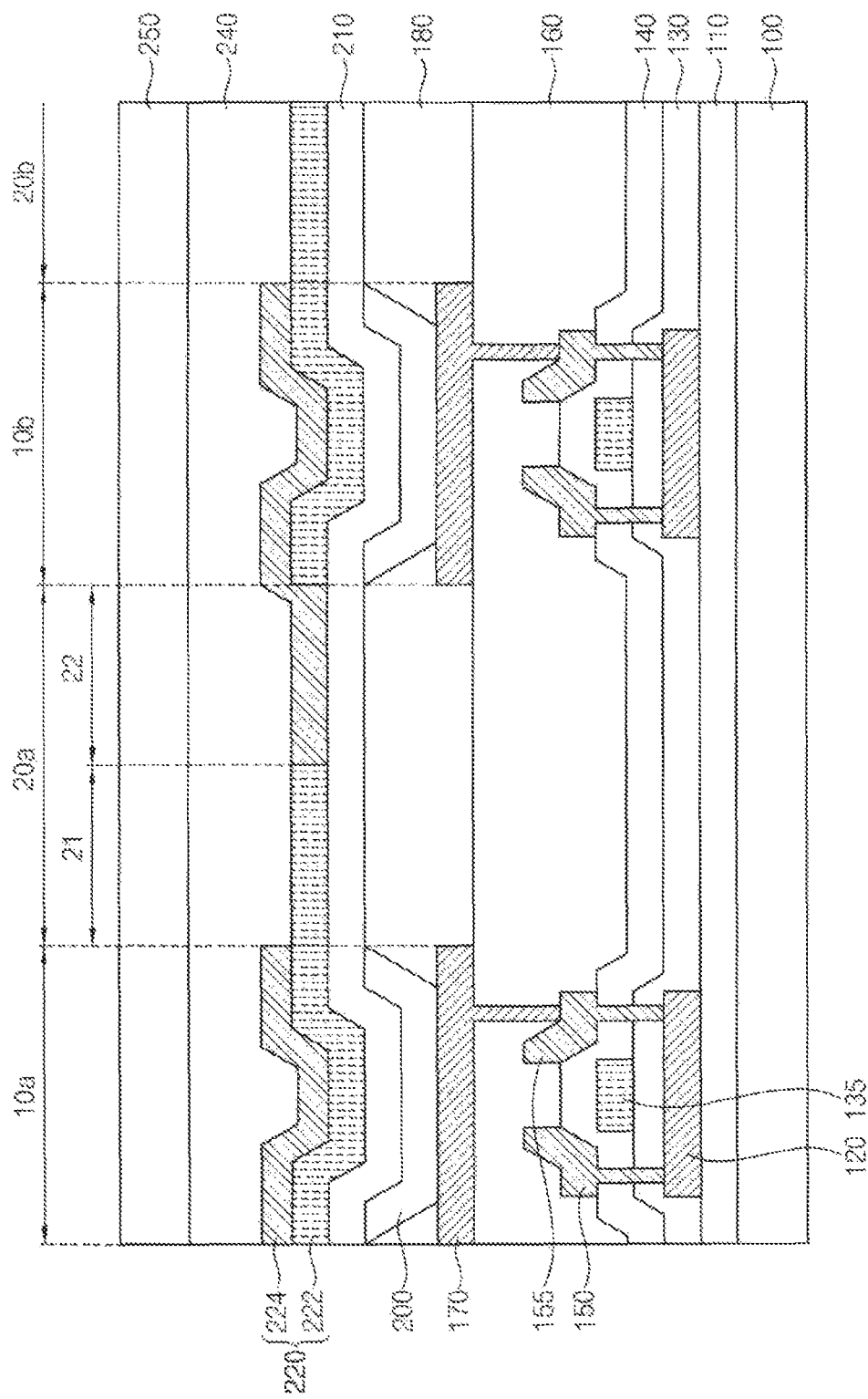
FIG. 3 is a cross-sectional view illustrating a transparent display device in accordance with example embodiments.

FIG. 1 is a plan view illustrating a transparent display device in accordance with example embodiments. FIG. 2 is a plan view illustrating further details of an area I of the transparent display device in FIG. 1. FIG. 3 is a cross-sectional view illustrating a transparent display device in accordance with example embodiments. For example, FIG. 3 may be a cross sectional view cut along a line in FIG. 2.

Referring to FIGS. 1 and 2, the transparent display device may include a plurality of unit pixels PX. The unit pixels PX may be arranged along a first direction and a second direction which are substantially parallel with a top surface of a substrate (100 in FIG. 3) and substantially perpendicular to each other.

Each of the unit pixels PX may include a pixel region 10 and a transmission region 20. A plurality of sub-pixel regions may be disposed in the pixel region 10. In example embodiments, the pixel region 10 may include a red sub-pixel region 11, a green sub-pixel region 12, and a blue sub-pixel region 13. For example, the sub-pixel regions 11 to 13 may be arranged along the second direction.

FIGS. 1 and 2 illustrate that the sub-pixel regions 11 to 13 have substantially the same area. However, the red sub-pixel region 11, the green sub-pixel region 12, and the blue sub-pixel region 13 may have different relative sizes or areas, so as to improve luminescent efficiency.

The transmission region 20 may extend to be adjacent to the red sub-pixel region 11, the green sub-pixel region 12, and the blue sub-pixel region 13. In example embodiments, the transmission region 20 may be provided individually to each of the unit pixels PX. In some example embodiments, the transmission region 20, for example, may extend along the second direction, and may be provided commonly to a plurality of the unit pixels PX. That is, a separate transmission region 20 may be provided for each sub-pixel region, or a common transmission region 20 may be provided for more than one, or for all, sub-pixel regions.

In example embodiments, a pixel circuit for implementation of an image may be disposed in the pixel region 10. External light may pass through the transmission region 20, so that an external image may be observed.

A transistor (e.g., a thin film transistor; TFT) may be disposed in each of the sub-pixel regions of the pixel region 10. The transistor may be electrically connected to a data line 151 and a scan line 136. As illustrated in FIG. 2, the data line 151 and the scan line 136 may cross each other. In example embodiments, the pixel circuit may include the data line 151, the scan line 136, the transistor, etc.

The pixel circuit, for example, may further include a power supply line (not shown in FIG. 2) substantially parallel with the data line 151. The pixel circuit may further include a capacitor electrically connected between the power supply line and the transistor.

FIG. 2 illustrates that one transistor is disposed in each of the sub-pixel regions. However, two or more transistors may be disposed in each of the sub-pixel regions. For example, a switching transistor and a driving transistor may be disposed in each of the sub-pixel regions. The capacitor may be electrically connected between the switching transistor and the driving transistor.

Referring to FIG. 3, the transistor may be disposed on the substrate 100 in the pixel region 10. The transistor may include an active pattern 120, a gate insulation layer 130, a gate electrode 135, an insulation interlayer 140, a source electrode 150 and a drain electrode 155. The transistor may be covered by a via insulation layer 160, and a first electrode 170 electrically connected to the drain electrode 155 of the transistor may be disposed on the via insulation layer 160.

A transparent insulation substrate may be used as the substrate 100. For example, the substrate 100 may include glass or polymer that is transparent and flexible. The transparent display device may be provided as a transparent flexible display device when the substrate 100 includes a polymer. For example, the substrate 100 may include a high molecular material such as polyimide, polysiloxane, epoxy based resin, acryl based resin, polyester, etc.

The substrate 100 may be divided into the pixel region 10 and the transmission region 20 as mentioned above. FIG. 3 illustrates a first pixel region 10a and a first transmission region 20a included in a first unit pixel PXa, and a second pixel region 10b and a second transmission region 20b included in a second unit pixel PXb. However, unless otherwise specified, the first pixel region 10a and the second pixel region 10b will be referred as the pixel region 10 and the first transmission region 20a and the second transmission region 20b will be referred as the transmission region 20, since the first unit pixel PXa and the second unit pixel PXb are substantially the same.

The buffer layer 110 may be formed on the top surface of the substrate 100. In some example embodiments, the buffer layer 110 may be provided commonly in the pixel region 10 and the transmission region 20 on the substrate 100. In some example embodiments, the buffer layer 110 may be substantially provided only in the pixel region 10 on the substrate 100. The buffer layer 110 may block a permeation of vapor through the substrate 100, and may block a diffusion of impurities between the substrate 100 and a structure disposed thereon. For example, the buffer layer 110 may include silicon oxide, silicon nitride or silicon oxynitride. These may be used alone or in any combination thereof. In some example embodiments, the buffer layer 110 may have a multi-layered structure including a silicon oxide layer and a silicon nitride layer.

The active pattern 120 may be disposed on the buffer layer 110 in the pixel region 10. The active pattern 120 may include a silicon compound such as polysilicon. In some example embodiments, a source region and a drain region each including p-type or n-type impurities may be disposed on opposing ends of the active pattern 120.

In some example embodiments, the active pattern 120 may include an oxide semiconductor, e.g., indium gallium zinc oxide (IGZO), zinc tin oxide (ZTO), indium tin zinc oxide (ITZO), or the like.

The gate insulation layer 130 may be disposed on the buffer layer 110, and may cover the active pattern 120. In example embodiments, the gate insulation layer 130 may include silicon oxide, silicon nitride or silicon oxynitride. In some example embodiments, the gate insulation layer 130 may have a multi-layered structure including a silicon oxide layer and a silicon nitride layer.

As illustrated in FIG. 3, the gate insulation layer 130 may extend across both the pixel region 10 and the transmission region 20, similar to the buffer layer 110. In some example embodiments, the gate insulation layer 130 may be substantially selectively disposed only in the pixel region 10.

The gate electrode 135 may be disposed on the gate insulation layer 130. The gate electrode 135 may substantially overlap the active pattern 120 with respect to the gate insulation layer 130.

The gate electrode 135 may be electrically connected to the scan line 136. For example, as illustrated in FIG. 2, the gate electrode 135 may formed to extend from the scan line 136.

The gate electrode 135 may include a metal such as silver (Ag), magnesium (Mg), aluminum (Al), tungsten (W), copper (Cu), nickel (Ni), chromium (Cr), molybdenum (Mo), titanium (Ti), platinum (Pt), tantalum (Ta), neodymium (Nd) and scandium (Sc), an alloy thereof, or a nitride thereof. These may be used alone or in any combination thereof. The gate electrode 135 may include at least two metal layers having different physical and/or chemical properties. For example, the gate electrode 135 may have a multi-layered structure such as an Al/Mo structure or a Ti/Cu structure.

The insulation interlayer 140 may be disposed on the gate insulation layer 130, and may cover the gate electrode 135. In example embodiments, the insulation interlayer 140 may include silicon oxide, silicon nitride and/or silicon oxynitride. In some example embodiments, the insulation interlayer 140 may have a multi-layered structure including a silicon oxide layer and a silicon nitride layer.

As illustrated in FIG. 3, the insulation interlayer 140 may commonly extend across both the pixel region 10 and the transmission region 20, similar to the buffer layer 110. In some example embodiments, the insulation interlayer 140 may be substantially selectively disposed only in the pixel region 10.

The source electrode 150 and the drain electrode 155 may contact the active pattern 120 through the insulation interlayer 140 and the gate insulation layer 130. Each of the source electrode 150 and the drain electrode 155 may include a metal such as Ag, Mg, Al, W, Cu, Ni, Cr, Mo, Ti, Pt, Ta, Nd and Sc, an alloy thereof, or a nitride thereof. These may be used alone or in some combination thereof. For example, each of the source electrode 150 and the drain electrode 155 may have a multi-layered structure having at least two metal layers which have different physical and/or chemical properties, such as an Al layer and a Mo layer.

The source electrode 150 and the drain electrode 155 may contact the source region and the drain region of the active pattern 120, respectively. A portion of the active pattern 120 between the source region and the drain region may serve as a channel through which charges may be moved or transferred.

As illustrated in FIG. 2, the source electrode 150 may be electrically connected to the data line 151. For example, the source electrode 150 may extend from the data line 151.

FIG. 3 illustrates that the transistor has a top gate structure in which the gate electrode 135 is disposed over the active pattern 120. However, the transistor may have a bottom gate structure in which the gate electrode 135 is disposed under the active pattern 120.

The via insulation layer 160 may be disposed on the insulation interlayer 140, and may cover the source electrode 150 and the drain electrode 155. A via structure electrically connecting the first electrode 170 and the drain electrode 155 to each other may be accommodated in the via insulation layer 160. The via insulation layer 160 may have a substantially planar or leveled top surface, and may serve as a planarization layer for structures thereon.

The via insulation layer 160 may include an organic material, e.g., polyimide, an epoxy-based resin, an acryl-based resin, polyester, or the like. In example embodiments, the via insulation layer 160 may be commonly disposed in both the pixel region 10 and the transmission region 20. In some example embodiments, the via insulation layer 160 may be substantially selectively disposed in just the pixel region 10.

The first electrode 170 may be disposed on the via insulation layer 160, and may include a via structure extending through the via insulation layer 160 to be in contact with, or electrically connected to, the drain electrode 155. In example embodiments, the first electrode 170 may be individually disposed per each of the sub-pixel regions. The first electrode 170 may serve as a pixel electrode or an anode.

In an embodiment, the first electrode 170 may include a transparent conductive material having a relatively high work function. For example, the first electrode 170 may include indium tin oxide (ITO), indium zinc oxide (IZO), zinc oxide, or indium oxide. In this case, a light transmittance of the transparent display device may be further improved.

In an embodiment, the first electrode 170 may serve as a reflective electrode. In this case, the first electrode 170 may include a metal, e.g., Al, Mg, Ag, W, Cu, Ni, Cr, Mo, Ti, Pt, Ta, Nd or Sc, or an alloy thereof.

In an embodiment, the first electrode 170 may have a multi-layered structure including the transparent conductive material and the metal.

A pixel defining layer 180 may be disposed on the via insulation layer 160, and may cover a peripheral portion of the first electrode 170. The pixel defining layer 180 may include a transparent organic material such as polyimide or an acryl-based resin.

Each of the sub-pixel regions included in the pixel region 10 may be exposed by the pixel defining layer 180. An area of the first electrode 170 which is not covered by the pixel defining layer 180 may be substantially equal to a light emitting area of each of the sub-pixel regions. In example embodiments, the pixel defining layer 180 may extend to the transmission region 20. In some example embodiments, the pixel defining layer 180 may not extend to the transmission region 20, and may be substantially selectively disposed only in the pixel region 10.

A display layer 200 may be disposed on the pixel defining layer 180 and the first electrode 170. For example, the display layer 200 may be disposed on a sidewall of the pixel defining layer 180 and a top surface of the first electrode 170 exposed by the pixel defining layer 180.

The display layer 200 may include an organic light emitting layer patterned individually for the red sub-pixel region 11, the green sub-pixel region 12, and the blue sub-pixel region 13 to generate a different color at each of the sub-pixel regions. The organic light emitting layer may include a host material excited by holes and electrons, and a dopant material facilitating an emitting efficiency through absorbing and releasing energy.

In some embodiments, the display layer 200 may further include a hole transport layer (HTL) between the first electrode 170 and the organic light emitting layer. The display layer 200 may further include an electron transport layer (ETL) on the organic light emitting layer.

The HTL may include a hole transport material, e.g., 4,4'-bis[N-(1-naphtyl)-N-phenyl amino]biphenyl (NPB), 4,4'-bis[N-(3-methylphenyl)-N-phenyl amino]biphenyl (TPD), N,N'-di-1-naphtyl-N,N'-diphenyl-1,1'-biphenyl-4,4'-diamine (NPD), N-phenylcarbazole, polyvinylcarbazole, or a combination thereof.

The ETL may include an electron transport material, e.g., tris(8-quinolinolato)aluminum (Alq3), 2-(4-biphenylyl)-5-4-tert-butylphenyl-1,3,4-oxadiazole (PBD), bis(2-methyl-8- quinolinolato)-4-phenylphenolato-aluminum (BAlq), bathocuproine (BCP), triazole (TAZ), phenylquinazoline, or a combination thereof.

In example embodiments, different from the organic light emitting layer, each of the HTL and the ETL may not be patterned individually for the red sub-pixel region 11, the green sub-pixel region 12 and the blue sub-pixel region 13, and may instead be provided commonly for the sub-pixel regions 11, 12 and 13.

In some embodiments, at least one of the organic light emitting layer, the HTL and the ETL may not be individually patterned for each of the sub-pixel regions, and may instead be provided commonly for a plurality of the sub-pixel regions. In an embodiment, the organic light emitting layer may be provided commonly for the plurality of the sub-pixel regions, and a color of each of the sub-pixel regions may be achieved by a color filter. In this case, the transparent display device may serve as a white-OLED (W-OLED) device.

In some embodiments, the display layer 200 may include a liquid crystal layer instead of the organic light emitting layer. In this case, the transparent display device may be provided as a liquid crystal display (LCD) device.

A second electrode 210 may be disposed on the pixel defining layer 180 and the display layer 200. The second electrode 210 may face the first electrode 170 with respect to the display layer 200.

In example embodiments, the second electrode 210 may serve as a common electrode commonly provided for a plurality of the sub-pixel regions. The second electrode 210 may serve as a cathode of the transparent display device.

In example embodiments, the second electrode 210 may include a metal having a low work function such as Ag, Mg, Al, W, Cu, Ni, Cr, Mo, Ti, Pt, Ta, Nd, Sc, or an alloy thereof. In some example embodiments, the second electrode 210 may include an alloy of Ag and Mg (e.g., $Ag_xMg_{1-x}$).

The second electrode 210 may continuously extend across both the pixel region 10 and the transmission region 20. A thickness of the second electrode 210 may be determined in consideration of a luminescent efficiency in the pixel region 10 and a desired light transmittance in the transmission region 20. In some embodiments, the second electrode 210 may be substantially removed in the transmission region 20.

A capping structure 220 may be disposed on the second electrode 210. In example embodiments, the capping structure 220 may substantially cover a top surface of the second electrode 210, and may be commonly provided across both the pixel region 10 and the transmission region 20.

The capping structure 220 may include a first capping layer 222 and a second capping layer 224. The first capping layer 222 may be disposed on the second electrode 210 in the pixel region 10, and on a first region 21 of the transmission region 20. In example embodiments, the first capping layer 222 may cover the top surface of the second electrode 210, and may be commonly provided in both the pixel region 10 and the first region 21 of the transmission region 20. For example, the first region 21 may be a region adjacent to the first pixel region 10a in the first transmission region 20a.

The second capping layer 224 may be disposed on the second electrode 210 in the pixel region 10, and in a second region 22 of the transmission region 20. In example embodiments, the second capping layer 224 may cover the top surface of the second electrode 210 and a top surface of the first capping layer 222, and may be commonly provided across the pixel region 10 and the second region 22 of the transmission region 20. For example, the second region 22 may be a region spaced apart from the first pixel region 10a in the first transmission region 20a. In other words, the second region 22 may be adjacent to the second pixel region 10b.

In example embodiments, an end portion of the first region 21 and an end portion of the second region 22 may be substantially adjacent to each other in the transmission region 20. In other words, the first region 21 and the second region 22 may not overlap, and may not be spaced apart from each other. In example embodiments, an area of the first region 21 and an area of the second region 22 may be substantially the same. For example, each of the area of the first region 21 and the area of the second region 22 may be substantially equal to a half of an area of the transmission region 20.

In example embodiments, the capping structure 220 may have a first thickness in the pixel region 10, and may have a second thickness less than the first thickness in the transmission region 20. For example, the first thickness may correspond to the sum of a thickness of the first capping layer 222 and a thickness of the second capping layer 224.

In example embodiments, the first capping layer 222 and the second capping layer 224 may have substantially the same thickness. In this case, the capping structure 220 may have a substantially uniform thickness throughout the transmission region 20.

Each of the first capping layer 222 and the second capping layer 224 may include an organic material having an improved transmissive property. In some embodiments, each of the first capping layer 222 and the second capping layer 224 may include a material substantially the same as or similar to the hole transport material. Thus, a light emitting property in the pixel region 10 may not be disturbed by the second electrode 210 serving as the cathode.

In example embodiments, the thickness of the first capping layer 222 and the thickness of the second capping layer 224 may be determined in consideration of improving or maximizing luminescent efficiency in the pixel region 10 and improving or maximizing light transmittance in the transmission region 20.

As mentioned above, when the capping structure 220 has a first thickness substantially equal to the sum of the thickness of the first capping layer 222 and the thickness of the second capping layer 224 in the pixel region 10, and has a second thickness substantially equal to the thickness of the first capping layer 222 or the thickness of the second capping layer 224 in the transmission region 20, the luminescent efficiency in the pixel region 10 as well as the light transmittance in the transmission region 20 may be improved.

In a conventional transparent display device, a capping layer having a substantially uniform thickness and provided commonly across both the pixel region and the transmission region may be disposed on the second electrode. However, luminescent efficiency in the pixel region may be reduced when the capping layer has a relatively small thickness, and light transmittance in the transmission region may be reduced when the capping layer has a relatively large thickness.

According to example embodiments then, the capping structure 220 may have a first thickness in the pixel region 10 and may have a second thickness less than the first thickness in the transmission region 20, so that luminescent efficiency in the pixel region 10 as well as light transmittance in the transmission region 20 may both be improved.

In some example embodiments, as illustrated in FIG. 3, an encapsulation substrate 250 may be disposed over the capping structure 220, and a filling layer 240 may be interposed between the capping structure 220 and the encapsulation substrate 250. A bonding member may be disposed between a peripheral portion of the substrate 100 and a peripheral portion of the encapsulation substrate 250 to store the filling layer 240 and to combine the substrate 100 and the encapsulation substrate 250.

The encapsulation substrate 250 may include a glass substrate or a polymer substrate. The filling layer 240 may include, e.g., a substantially transparent or transmissive organic material. In some embodiments, an organic/inorganic complex layer may be utilized as a sealing film instead of the encapsulation substrate 250 and the filling layer 240. In this case, the bonding member may not be needed.

Figure 4:
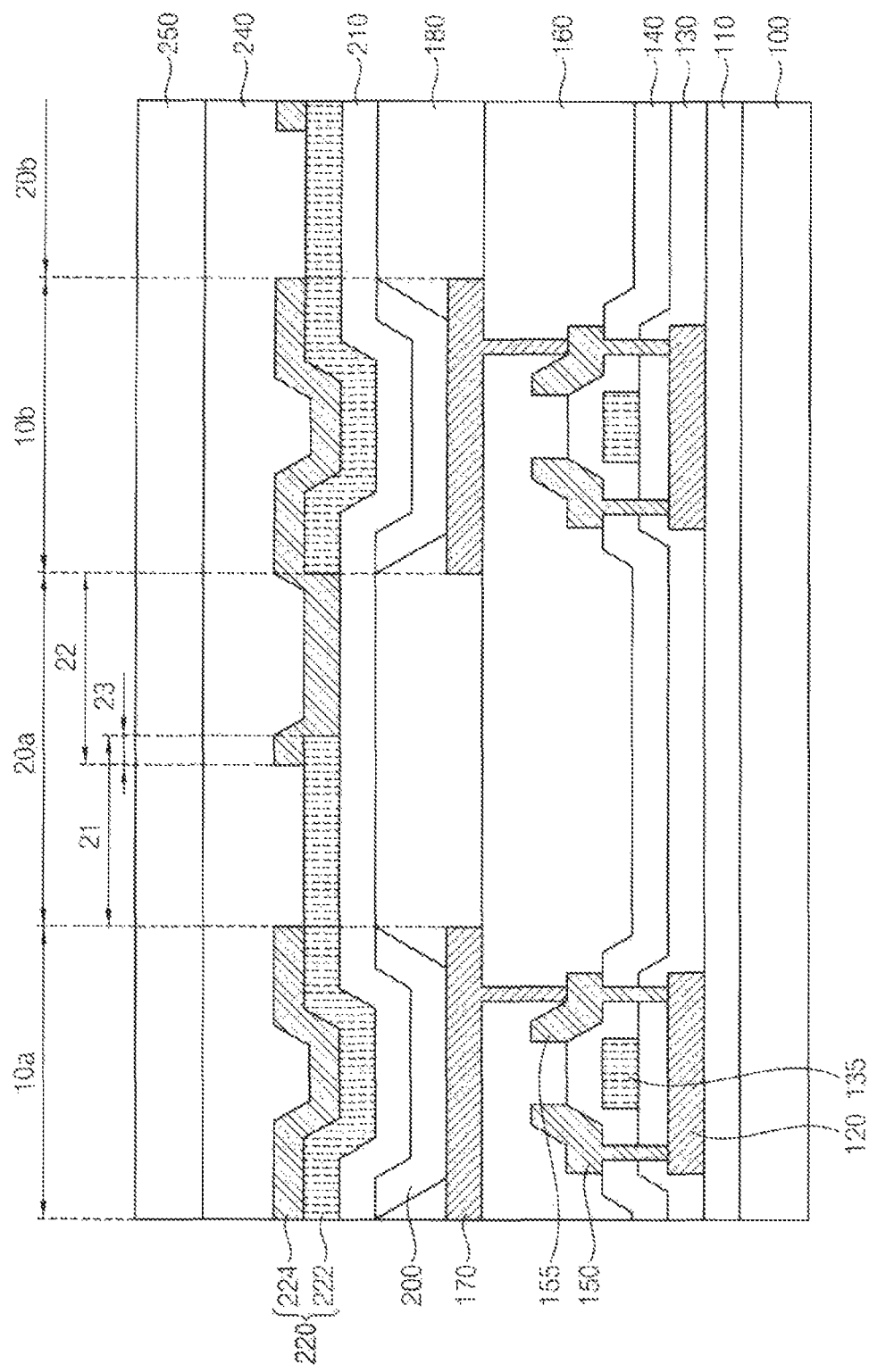
FIG. 4 is a cross-sectional view illustrating a transparent display device in accordance with some example embodiments.

FIG. 4 is a cross-sectional view illustrating a transparent display device in accordance with some example embodiments.

The transparent display device illustrated in FIG. 4 may have elements and/or constructions substantially the same as or similar to the transparent display device illustrated in FIG. 3, except for constructions of the first capping layer 222 and the second capping layer 224 in the transmission region 20. Therefore, detailed descriptions of repeated elements and/or constructions are omitted, and like reference numerals are used to designate like elements.

Referring to FIG. 4, the transmission region 20 may further include a third region 23 in which at least a portion of the first region 21 and at least a portion of the second region 22 overlap. In other words, the first region 21 in which the first capping layer 222 is disposed, and the second region 22 in which the second capping layer 224 is disposed, may at least partially overlap, and the area of overlap may be defined as the third region 23. For example, the first capping layer 222 may be disposed on the second electrode 210 and the second capping layer 224 may be disposed on the first capping layer 222 in the third region 23, similar to the pixel region 10.

In example embodiments, an area of the first region 21 and an area of the second region 22 may be substantially the same. For example, each of the area of the first region 21 and the area of the second region 22 may be substantially greater than a half of an area of the transmission region 20.

In example embodiments, the capping structure 220 may have a first thickness in the pixel region 10 and in the third region 23 of the transmission region 20, and may have a second thickness less than the first thickness in a remaining transmission region 20 outside the third region 23. For example, the first thickness may be substantially equal to the sum of a thickness of the first capping layer 222 and a thickness of the second capping layer 224, and the second thickness may be substantially equal to either the thickness of the first capping layer 222 or the thickness of the second capping layer 224.

In example embodiments, the first capping layer 222 and the second capping layer 224 may have substantially the same thickness. In this case, the capping structure 220 may have a substantially uniform thickness throughout the remaining transmission region 20 except for the third region 23.

Figure 5:
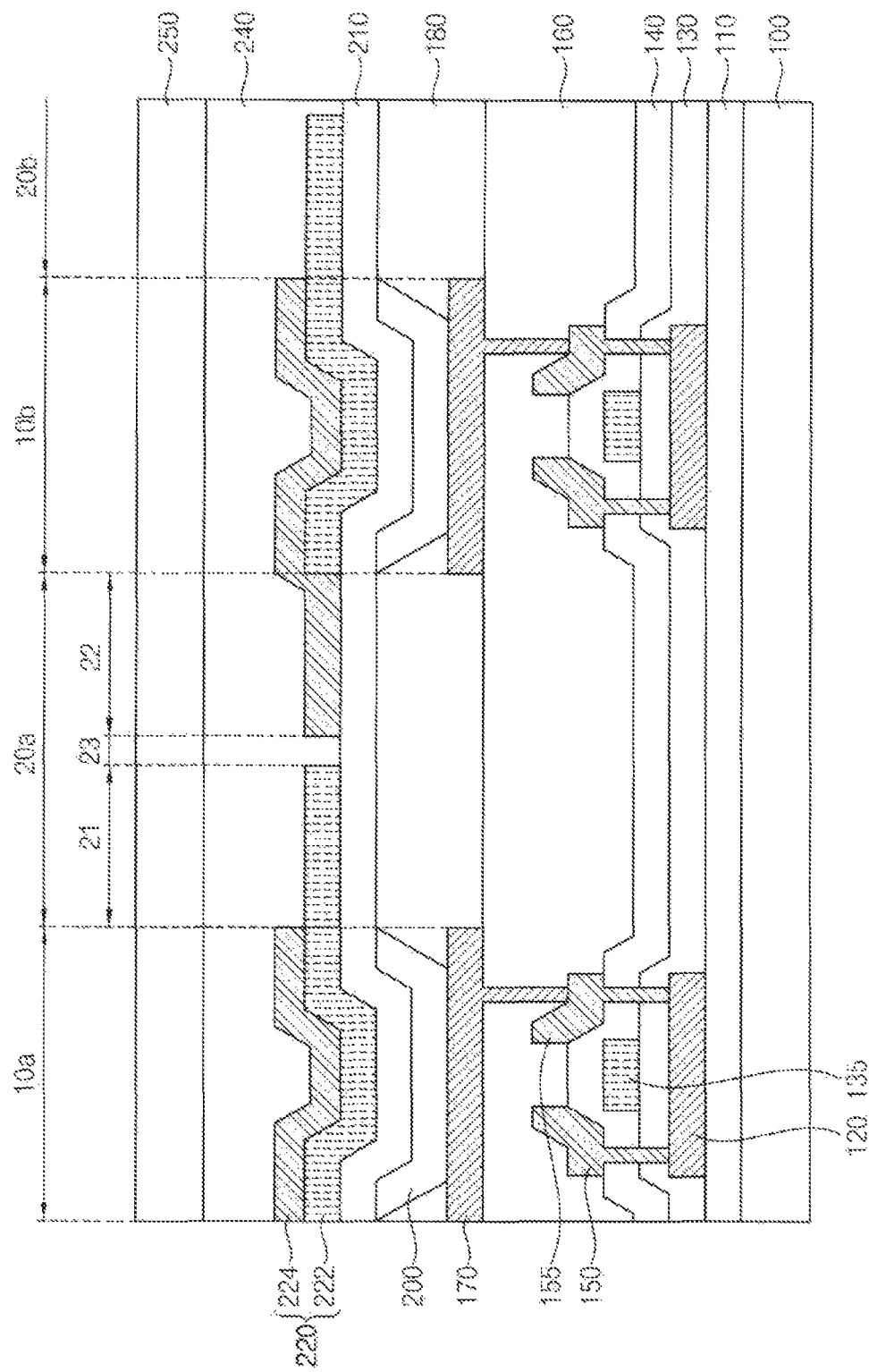
FIG. 5 is a cross-sectional view illustrating a transparent display device in accordance with some example embodiments.

FIG. 5 is a cross-sectional view illustrating a transparent display device in accordance with some example embodiments.

The transparent display device illustrated in FIG. 5 may have elements and/or constructions substantially the same as or similar to the transparent display device illustrated in FIGS. 3 and 4, except for constructions of the first capping layer 222 and the second capping layer 224 in the transmission region 20. Therefore, detailed descriptions of repeated elements and/or constructions are omitted, and like reference numerals are used to designate like elements.

Referring to FIG. 5, the transmission region 20 may further include a third region 23 between the first region 21 and the second region 22. In other words, the first region 21 in which the first capping layer 222 is disposed, and the second region 22 in which the second capping layer 224 is disposed, may be spaced apart from each other. The intervening space between the first region 21 and the second region 22 may be defined as the third region 23. For example, an opening defined by a sidewall of the first capping layer 222, a sidewall of the second capping layer 224 and an exposed top surface of the second electrode 210 may be formed in the third region 23.

In example embodiments, an area of the first region 21 and an area of the second region 22 may be substantially the same. For example, each of the area of the first region 21 and the area of the second region 22 may be substantially less than a half of an area of the transmission region 20.

In example embodiments, the capping structure 220 may have a first thickness in the pixel region 10, and may have a second thickness less than the first thickness in the first region 21 and the second region 22. For example, the first thickness may be substantially equal to a sum of a thickness of the first capping layer 222 and a thickness of the second capping layer 224, and the second thickness may be substantially equal to the individual thickness of the first capping layer 222 or the individual thickness of the second capping layer 224.

In example embodiments, the first capping layer 222 and the second capping layer 224 may have substantially the same thickness. In this case, the capping structure 220 may have a substantially uniform thickness throughout a remaining transmission region 20 except for the third region 23.

Figure 6:
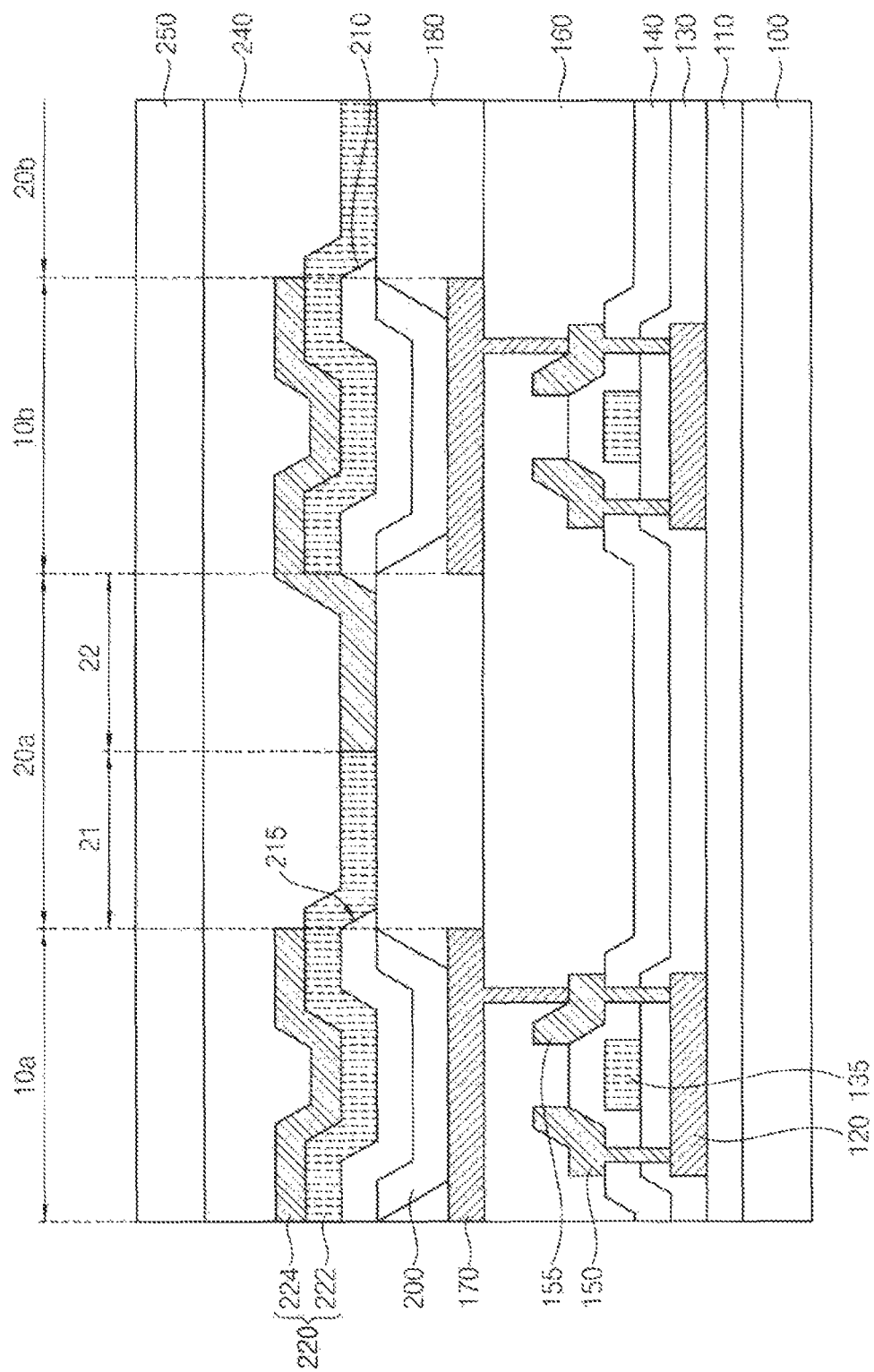
FIGS. 6 to 8 are cross-sectional views illustrating transparent display devices in accordance with some example embodiments.
Figure 7:
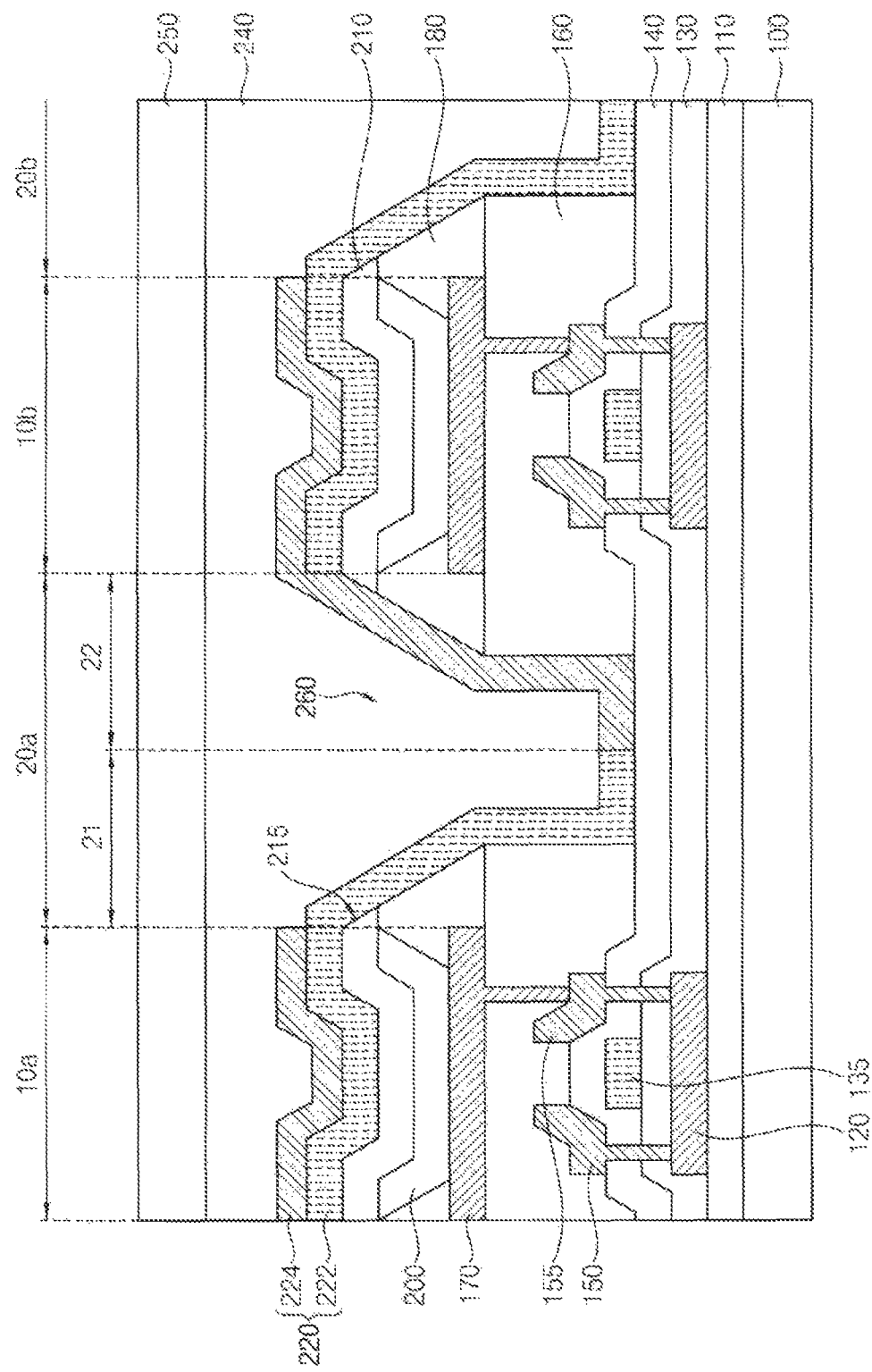
Figure 8:
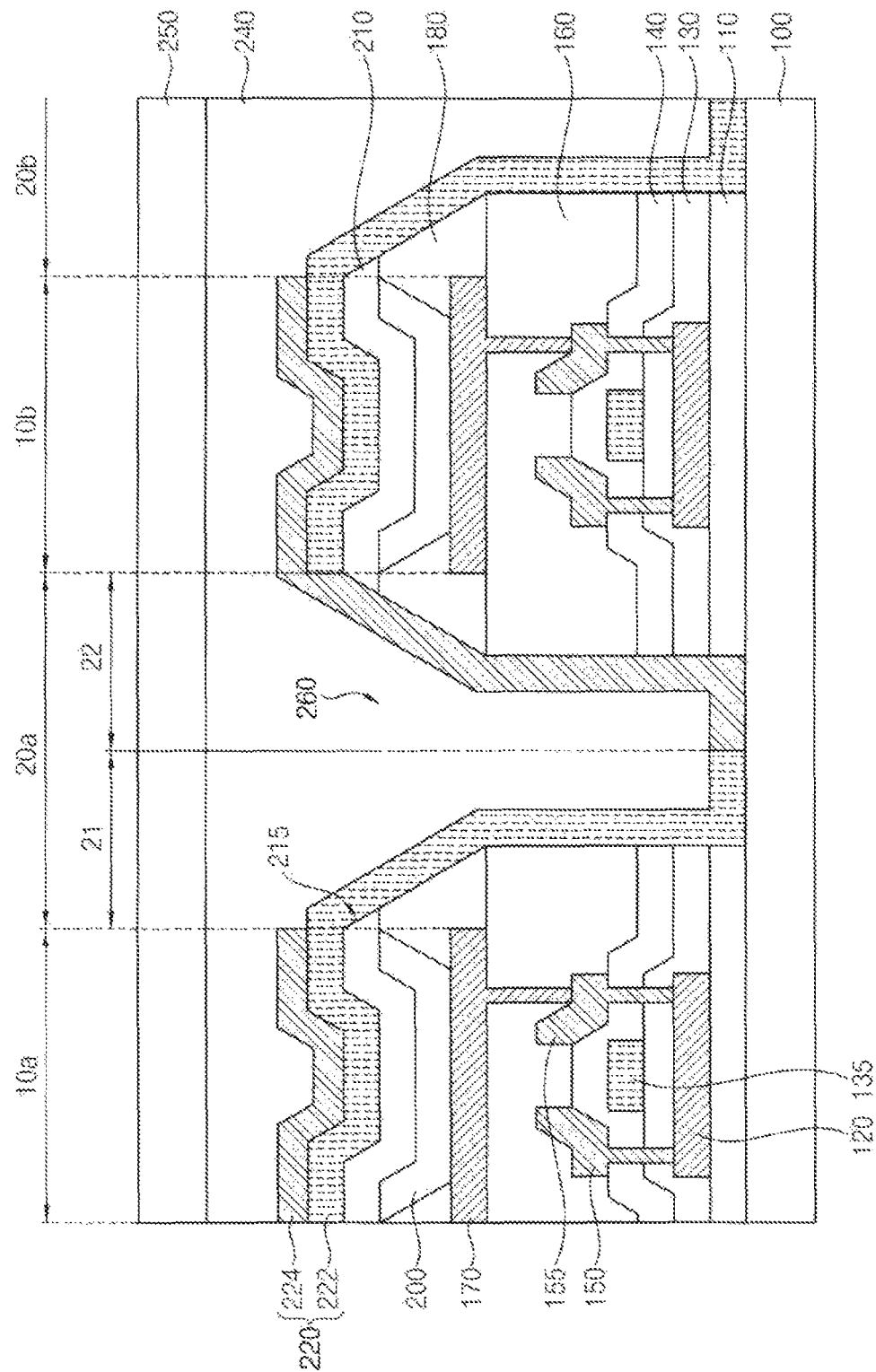

FIGS. 6 to 8 are cross-sectional views illustrating transparent display devices in accordance with some example embodiments.

The transparent display device illustrated in FIGS. 6 to 8 may have elements and/or constructions substantially the same as or similar to the transparent display device illustrated in FIG. 3, except for constructions of the second electrode 210, the pixel defining layer 180, the via insulation layer 160, the insulation interlayer 140, the gate insulation layer 130 and/or the buffer layer 110 in the transmission region 20. Therefore, detailed descriptions of any repeated elements and/or constructions are omitted, and like reference numerals are used to designate like elements.

Referring to FIG. 6, the second electrode 210 may include an aperture 215 that overlaps at least a portion of the transmission region 20. In some example embodiments, the aperture 215 may overlap substantially all of the transmission region 20. For example, the capping structure 220 may be disposed on a top surface of the pixel defining layer 180 which is exposed by the aperture 215 of the second electrode 210. As the second electrode 210 includes apertures 215, the light transmittance of the transmission region 20 may be improved.

Referring to FIG. 7, at least portions of the pixel defining layer 180 and the via insulation layer 160 may be substantially removed. In example embodiments, a transparent window 260 may be defined by a top surface of the insulation interlayer 140, a sidewall of the via insulation layer 160, and a sidewall of the pixel defining layer 180 in the transmission region 20. As the transparent window 260 is formed, the light transmittance of the transmission region 20 may be improved. In this case, the capping structure 220 may be formed conformally along a surface of the second electrode 210 and a surface of the transparent window 260.

Referring to FIG. 8, at least portions of the insulation interlayer 140, the gate insulation layer 130 and the buffer layer 110 may be substantially removed. In example embodiments, a transparent window 260 may be defined by a top surface of the substrate 100, a sidewall of the buffer layer 110, a sidewall of the gate insulation layer 130, a sidewall of the insulation interlayer 140, a sidewall of the via insulation layer 160, and a sidewall of the pixel defining layer 180 in the transmission region 20. As the transparent window 260 is formed, the light transmittance of the transmission region 20 may be improved. In this case, the capping structure 220 may be formed conformally along a surface of the second electrode 210 and a surface of the transparent window 260.

FIGS. 6 to 8 illustrate that the first capping layer 222 and the second capping layer 224 are adjacent to each other as illustrated in FIG. 3, but the invention is not limited thereto.

The aperture 215 of the second electrode 210 and the transparent window 260 in the transmission region 20 illustrated in FIGS. 6 to 8 may be applied to a transparent display device in which the first capping layer 222 and the second capping layer 224 overlap as illustrated in FIG. 4, or a transparent display device in which the first capping layer 222 and the second capping layer 224 are spaced apart as illustrated in FIG. 5.

FIGS. 9 to 15 are cross-sectional views illustrating a method of manufacturing a transparent display device in accordance with example embodiments. For example, FIGS. 9 to 15 illustrate a method of manufacturing the transparent display device in FIG. 3.

Figure 9:
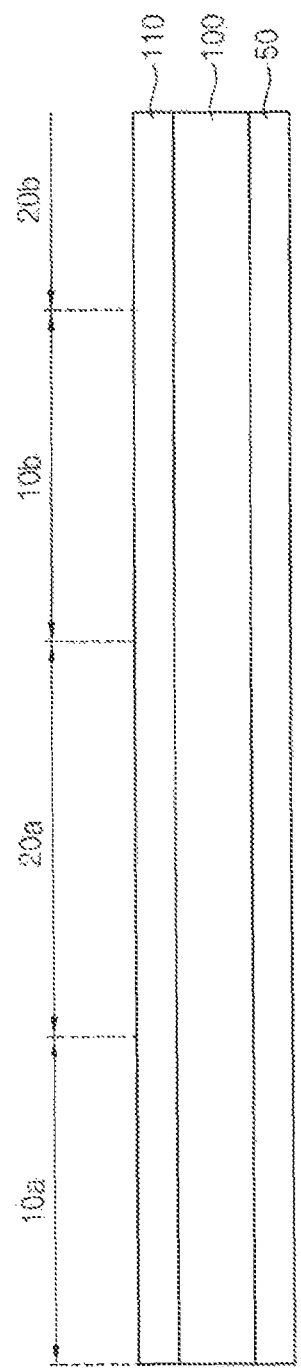
FIGS. 9 to 15 are cross-sectional views illustrating a method of manufacturing a transparent display device in accordance with example embodiments.

Referring to FIG. 9, a substrate 100 may be provided on a carrier substrate 50, and then a buffer layer 110 may be formed on the substrate 100.

The carrier substrate 50 may serve as a supporter for the substrate 100 during a manufacturing process of the transparent display device. For example, a glass substrate or a metal substrate may be utilized as the carrier substrate 50.

The substrate 100 may be formed using glass or a transparent polymer such as a polyimide-based resin. For example, a precursor composition containing a polyimide precursor may be coated on the carrier substrate 50 by, e.g., a spin coating process to form a coating layer. The coating layer may be thermally cured to form the substrate 100. The polyimide precursor may include a diamine and a dianhydride. The precursor composition may be prepared by dissolving the polyimide precursor in an organic solvent. The organic solvent may include, e.g., N-methyl-2-pyrrolidone (NMP), dimethylformamide (DMF), tetrahydrofuran (THF), triethylamine (TEA), ethylacetate, dimethylsulfoxide (DMSO) or an ethylene glycol-based ether solvent. These may be used alone or in any combination thereof.

The diamine and the dianhydride may be polymerized by the thermal curing process so that a polyamic acid may be created, and the polyamic acid may be additionally cured and condensed to form the polyimide-based resin. In one embodiment, when a glass substrate is utilized as the substrate 100, a process of using the carrier substrate 50 may be omitted.

The substrate 100 may be divided into a pixel region 10 and a transmission region 20. FIG. 9 illustrates a first pixel region 10a, a first transmission region 20a, a second pixel region 10b, and a second transmission region 20b. However, unless otherwise specified, the first pixel region 10a and the second pixel region 10b will be referred as the pixel region 10, and the first transmission region 20a and the second transmission region 20b will be referred as the transmission region 20, since the first pixel region 10a and the first transmission region 20a are substantially the same as the second pixel region 10b and the second transmission region 20b, respectively.

The buffer layer 110 may substantially cover a top surface of the substrate 100, and may be formed using silicon oxide, silicon nitride and/or silicon oxynitride. As illustrated in FIG. 9, the buffer layer 110 may be commonly formed across both the pixel region 10 and the transmission region 20. In some embodiments, the buffer layer 110 may be selectively formed in only the pixel region 10.

Figure 10:
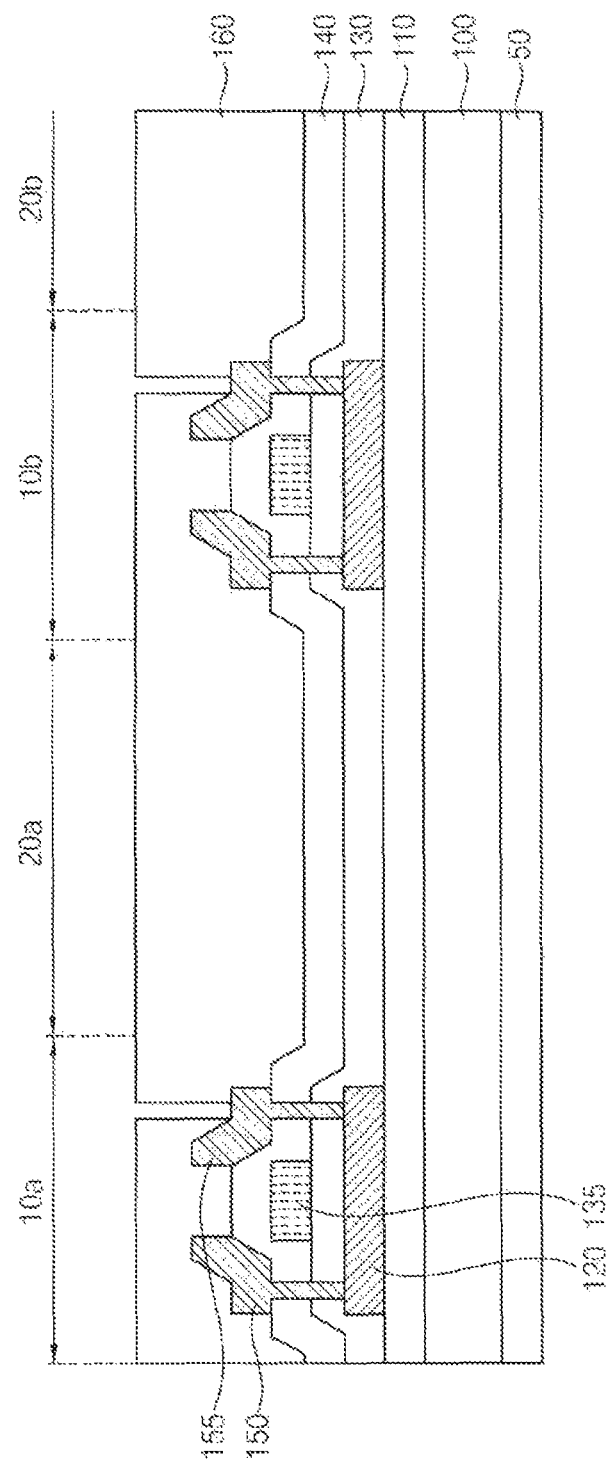

Referring to FIG. 10, an active pattern 120, a gate electrode 135, a source electrode 150, a drain electrode 155, and additional insulation layers may be formed on the buffer layer 110.

The active pattern 120 may be formed on the buffer layer 110 in the pixel region 10. For example, a semiconductor layer including amorphous silicon or polysilicon may be formed on the buffer layer 110, and then may be patterned to form the active pattern 120. In some embodiments, a crystallization process, e.g., a low temperature polycrystalline silicon (LTPS) process or a laser crystallization process, may be further performed after the formation of the semiconductor layer. In some embodiments, the semiconductor layer may be formed of an oxide semiconductor such as IGZO, ZTO or ITZO.

A gate insulation layer 130 covering the active pattern 120 may be formed on the buffer layer 110. The gate insulation layer 130 may be formed of silicon oxide, silicon nitride and/or silicon oxynitride.

As illustrated in FIG. 10, the gate insulation layer 130 may extend continuously across both the pixel region 10 and the transmission region 20. In some embodiments, the gate insulation layer 130 may be patterned to be present selectively in the pixel region 10.

The gate electrode 135 may be formed on the gate insulation layer 130, and may substantially overlap the active pattern 120. For example, a first conductive layer may be formed on the gate insulation layer 130. The first conductive layer may be patterned by, e.g., a photo-lithography process, to form the gate electrode 135. The first conductive layer may be formed using a metal, an alloy or a metal nitride. The first conductive layer may also be formed by depositing a plurality of metal layers.

The gate electrode 135 may be formed together with a scan line 136 illustrated in FIG. 2. For example, the gate electrode 135 and the scan line 136 may be formed from the first conductive layer by substantially the same etching process, and the scan line 136 may be integral with the gate electrode 135.

In some embodiments, impurities may be implanted into the active pattern 120 using the gate electrode 135 as an ion-implantation mask, such that a source region and a drain region may be formed at both ends of the active pattern 120.

An insulation interlayer 140 covering the gate electrode 135 may be formed on the gate insulation layer 130. The insulation interlayer 140 may include stepped portions according to profiles of the active pattern 120 and the gate electrode 135. The insulation interlayer 140 may be formed of silicon oxide, silicon nitride and/or silicon oxynitride.

As illustrated in FIG. 10, the insulation interlayer 140 may extend commonly across both the pixel region 10 and the transmission region 20. In some embodiments, at least a portion of the insulation interlayer 140 formed in the transmission region 20 may be removed.

The insulation interlayer 140 and the gate insulation layer 130 may be partially removed by, e.g., a photo process, to form contact holes. The contact holes may be formed through the insulation interlayer 140 and the gate insulation layer 130, such that a top surface of the active pattern 120 may be partially exposed. For example, the source region and the drain region of the active pattern 120 may be exposed through the contact holes.

A source electrode 150 and a drain electrode 155 may be formed in the contact holes. The source electrode 150 and the drain electrode 155 may be in contact with the source region and the drain region, respectively. For example, a second conductive layer sufficiently filling the contact holes may be formed on the insulation interlayer 140. The second conductive layer may be patterned by a photo-lithography process, to form the source electrode 150 and the drain electrode 155. The second conductive layer may be formed using a metal, a metal nitride or an alloy.

Accordingly, a transistor, e.g., a thin film transistor including the active pattern 120, the gate insulation layer 130, the gate electrode 135, the source electrode 150 and the drain electrode 155 may be formed on the substrate 100 in the pixel region 10. For example, a plurality of sub-pixel regions may be included in the pixel region 10 as illustrated in FIGS. 1 and 2, and at least one transistor may be formed in each of the sub-pixel regions.

Additionally, a pixel circuit including the transistor, a data line 151 and the scan line 136 may be formed on the substrate 100. The source electrode 150 may be electrically connected to the data line 151 as illustrated in FIG. 2. For example, the source electrode 150, the drain electrode 155 and the data line 151 may be formed from the second conductive layer by substantially the same etching process.

A via insulation layer 160 may be formed to cover the insulation interlayer 140, the source electrode 150 and the drain electrode 155. The via insulation layer 160 may extend commonly across both the pixel region 10 and the transmission region 20, and may have a substantially planar or leveled upper surface. Indeed, the via insulation layer 160 may serve as a planarization layer for the transparent display device.

The via insulation layer 160 may be formed using an organic material such as polyimide, an epoxy-based resin, an acryl-based resin or polyester, by a spin coating process or a slit coating process. For example, the via insulation layer 160 may be partially removed by, e.g., a photo process, to form a via hole. In example embodiments, a top surface of the drain electrode 155 may be at least partially exposed through the via hole.

As illustrated in FIG. 10, the via insulation layer 160 may extend commonly across each of the pixel region 10 and the transmission region 20. In some embodiments, the via insulation layer 160 may be patterned to be present selectively in the pixel region 10.

Figure 11:
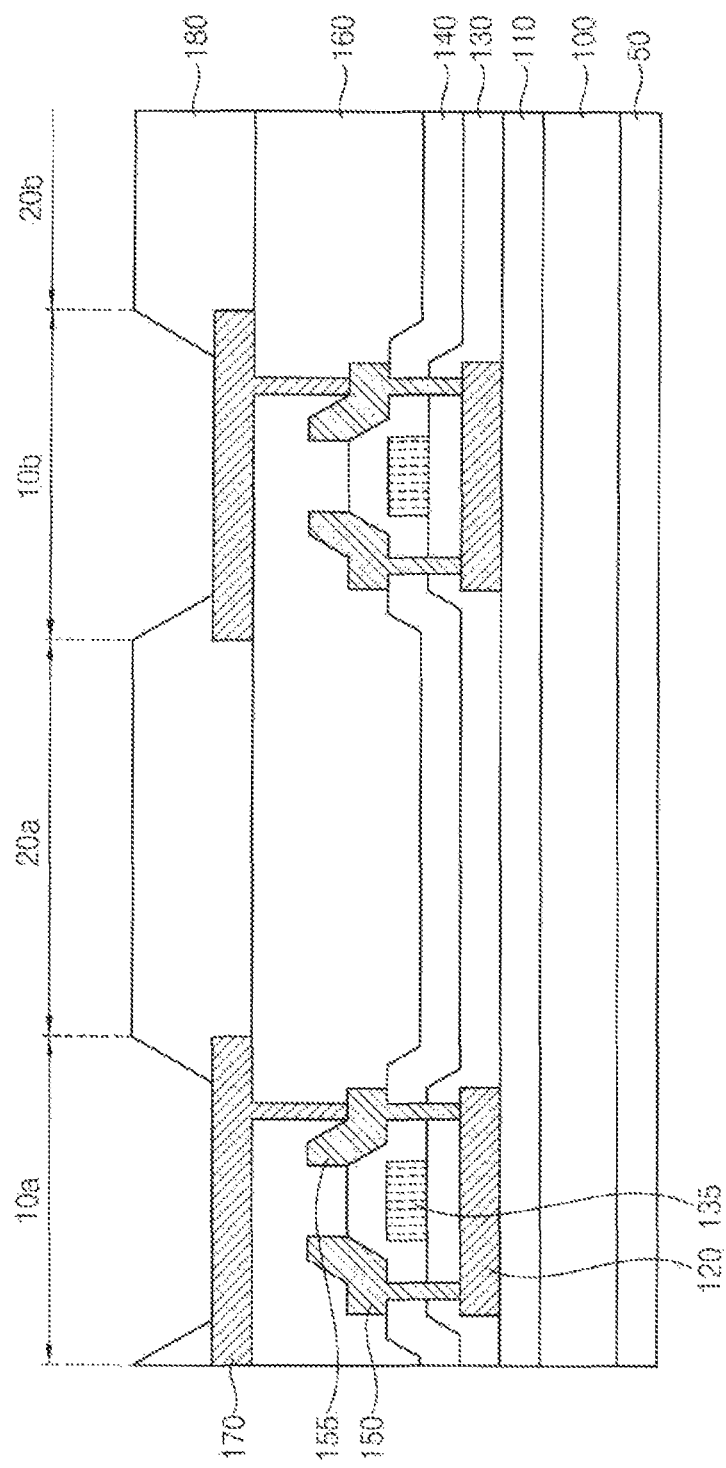

Referring to FIG. 11, a first electrode 170 and a pixel defining layer 180 may be formed on the via insulation layer 160.

For example, a third conductive layer filling the via hole may be formed on the via insulation layer 160 and the exposed drain electrode 155, and may be patterned to form the first electrode 170. The first electrode 170 may serve as a pixel electrode and/or an anode of the transparent display device. The third conductive layer may be formed of a metal such as Ag, Mg, Al, W, Cu, Ni, Cr, Mo, Ti, Pt, Ta, Nd, Sc, etc., or an alloy thereof.

The buffer layer 110, the semiconductor layer, the gate insulation layer 130, the insulation interlayer 140, and the first to third conductive layers may be formed by at least one of a chemical vapor deposition (CVD) process, a plasma enhanced chemical vapor deposition (PECVD) process, a high density plasma-chemical vapor deposition (HDP-CVD) process, a thermal evaporation process, a vacuum deposition process, a spin coating process, a sputtering process, an atomic layer deposition (ALD) process and a printing process.

The pixel defining layer 180 may be formed on the via insulation layer 160 to cover a peripheral portion of the first electrode 170. For example, a photosensitive organic material such as a polyimide resin or an acryl resin may be coated, and then exposure and developing processes may be performed to form the pixel defining layer 180. In some embodiments, the pixel defining layer 180 may be formed of a polymeric material or an inorganic material by a printing process, e.g., an inkjet printing process.

As illustrated in FIG. 11, the pixel defining layer 180 may extend commonly across both the pixel region 10 and the transmission region 20. In some embodiments, the pixel defining layer 180 may be patterned to be present selectively in the pixel region 10.

In example embodiments, the pixel defining layer 180 and the via insulation layer 160 formed in the transmission region 20 may be selectively removed, so that the pixel defining layer 180 and the via insulation layer 160 may remain only in the pixel region 10. Accordingly, the light transmittance of the transmission region 20 may be improved. In some example embodiments, the insulation interlayer 140, the gate insulation layer 130, and the buffer layer 110 formed in the transmission region 20, as well as the pixel defining layer 180 and the via insulation layer 160 formed in the transmission region 20, may be selectively removed so that the insulation interlayer 140, the gate insulation layer 130, and the buffer layer 110 may selectively remain only in the pixel region 10. Accordingly, the light transmittance of the transmission region 20 may be further improved.

Figure 12:
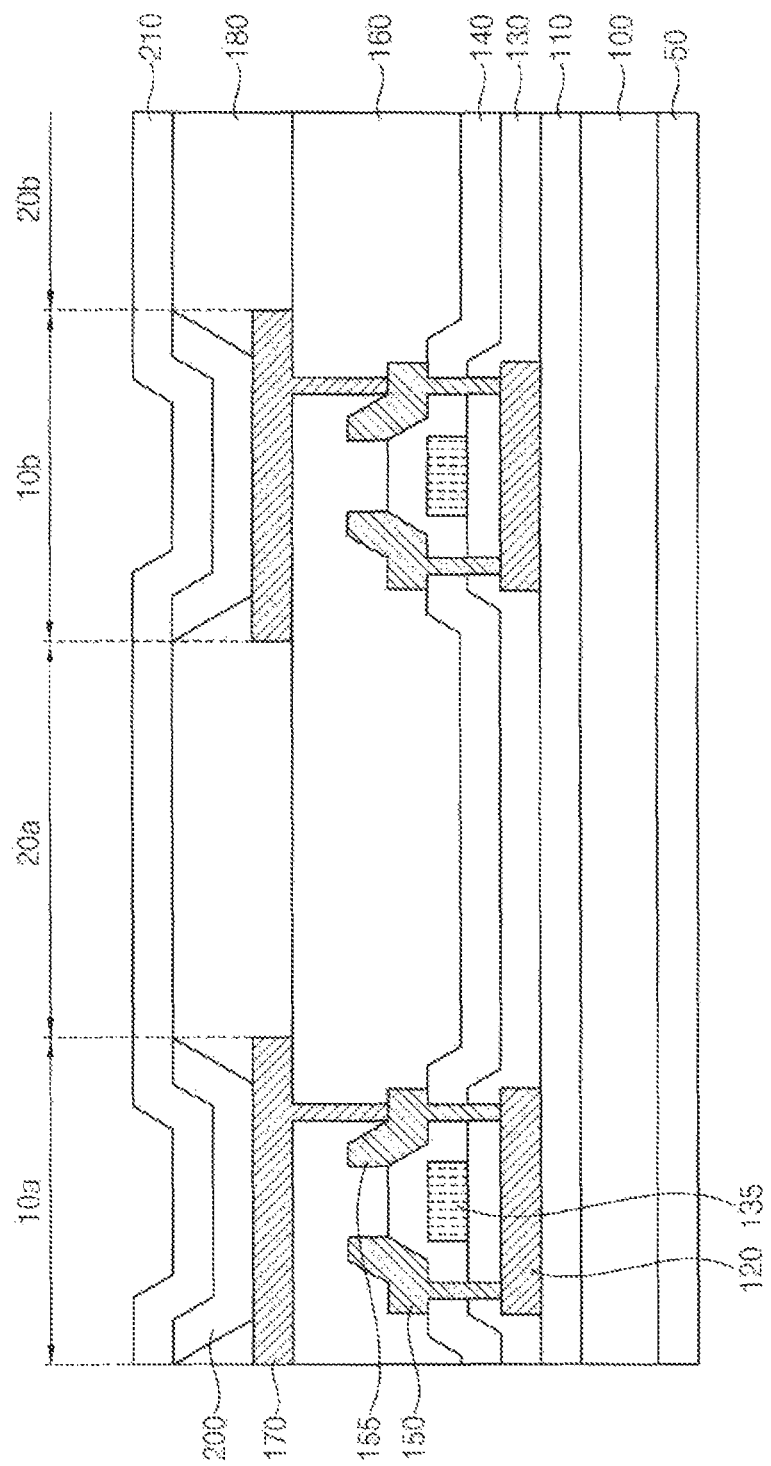

Referring to FIG. 12, a display layer 200 and a second electrode 210 may be sequentially formed on the pixel defining layer 180 and the first electrode 170.

The display layer 200 may be formed using an organic light emitting material for generating a red color of light, a green color of light or a blue color of light per each of the sub-pixel regions on the first electrode 170 exposed by the pixel defining layer 180. For example, the display layer 200 may be formed by a spin coating process, a roll printing process, a nozzle printing process, an inkjet process, etc., using a fine metal mask (FMM) that may include an opening through which a region corresponding to a red sub-pixel region, a green sub-pixel region, or a blue sub-pixel region is exposed. Accordingly, an organic light emitting layer, including the organic light emitting material, may be individually formed in each of the sub-pixel regions.

A hole transport layer may be formed before the formation of the organic light emitting layer, using the above-mentioned hole transport material. An electron transport layer may be also formed on the organic light emitting layer, using the above-mentioned electron transport material. In some example embodiments, unlike the organic light emitting layer, the hole transport layer and the electron transport layer may extend commonly over every sub-pixel region, rather than being individually patterned for each sub-pixel region. In some example embodiments, the hole transport layer and the electron transport layer may be included in the display layer 200, and may be patterned or printed per each of the sub-pixel regions. For example, as illustrated in FIG.

12, the display layer 200 of each of the sub-pixel regions may be confined by a sidewall of the pixel defining layer 180.

In some embodiments, at least one of the organic emitting layer, the hole transport layer and the electron transport layer may not be individually patterned for each of the sub-pixel regions, and may instead be formed commonly across a plurality of the sub-pixel regions. In an embodiment, the organic light emitting layer may be formed for a plurality of the sub-pixel regions, and a color of each of the sub-pixel regions may be achieved by a color filter. In this case, the transparent display device may serve as a white-OLED (W-OLED) device.

A metal having a low work function such as Al, Mg, Ag, W, Cu, Ni, Cr, Mo, Ti, Pt, Ta, Nd or Sc, or an alloy of these metals, may be deposited on the display layer 200 to form a second electrode 210. The second electrode 210 may serve as a common electrode and/or a cathode of the transparent display device. For example, an open mask, including an opening through which the pixel region 10 and the transmission region 20 are commonly exposed, may be used to deposit the metal by, e.g., a sputtering process, for the formation of the second electrode 210. The second electrode 210 may be formed common to the pixel region 10 and the transmission region 20 without an additional patterning process, so that the overall fabrication process may be simplified, and an electrical resistance of the second electrode 210 may be reduced.

In some example embodiments, the second electrode 210 may be formed of Ag, Mg or an alloy thereof. Further, a thickness of the second electrode 210 may be determined according to a desired luminescent efficiency in the pixel region 10 and a desired light transmittance in the transmission region 20.

Figure 13:
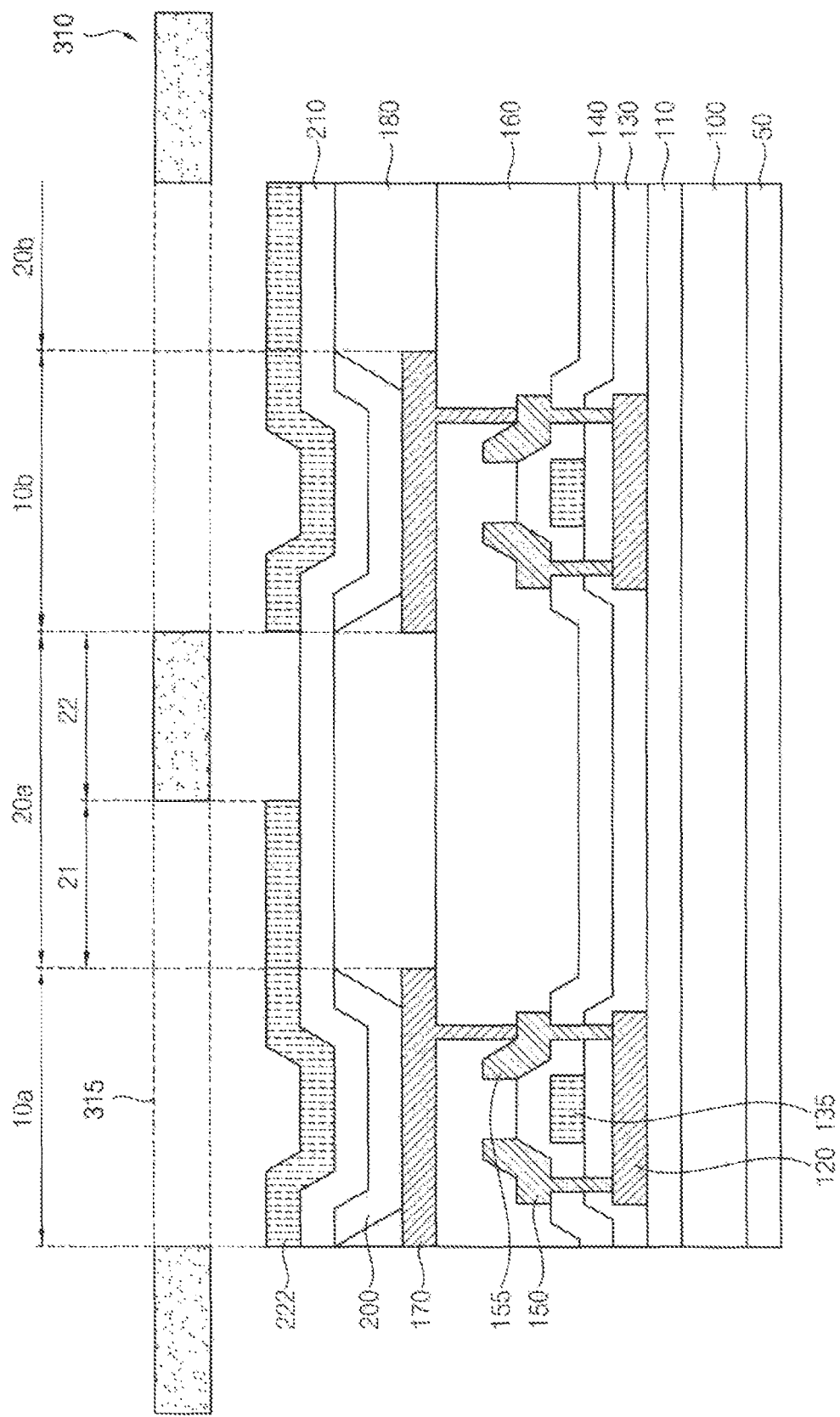
Figure 14:
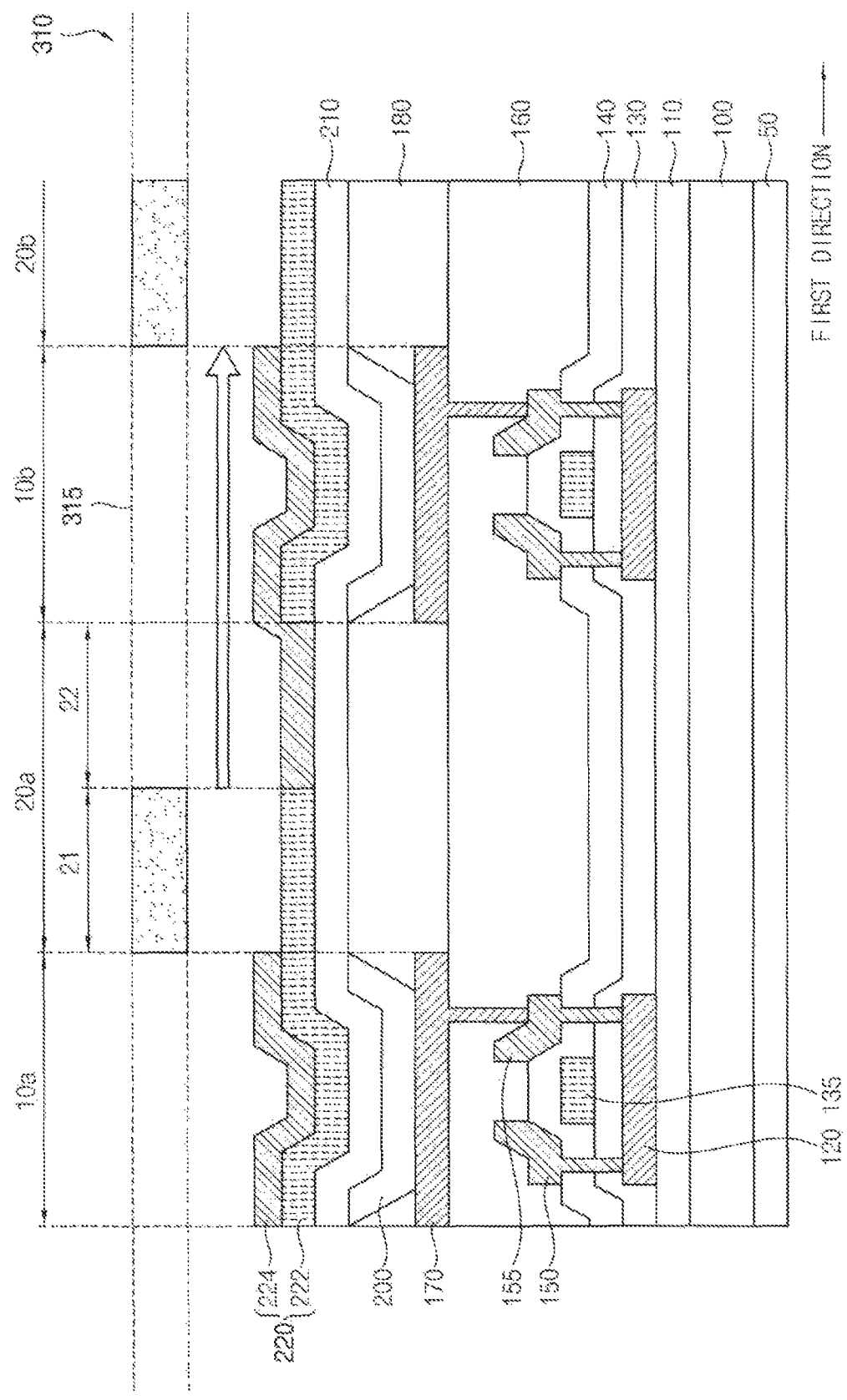

Referring to FIGS. 13 and 14, a capping structure 220 may be formed on the second electrode 210.

A first capping layer 222 may be formed on the second electrode 210, in both the pixel region 10 and a first region 21 of the transmission region 20. A second capping layer 224 may then be formed on the first capping layer 222 in the pixel region 10, and in a second region 22 of the transmission region 20. For example, the first region 21 may be a region adjacent to a first pixel region 10a in a first transmission region 20a, and the second region 22 may be a region spaced apart from the first pixel region 10a in the first transmission region 20a. In other words, the first region 21 may be adjacent to the first pixel region 10a, and the second region 22 may be adjacent to a second pixel region 10b.

As illustrated in FIG. 13, the first capping layer 222 may be formed in the pixel region 10 and the first region 21 by using a mask 310 that includes an opening 315. Specifically, after disposing the mask 310 such that the opening 315 corresponds to the first pixel region 10a and the first region 21, the first capping layer 222 may be formed using the hole transport material line of organic material. The mask 310 may be, for example, a fine metal mask (FMM).

Then, as illustrated in FIG. 14, the second capping layer 224 may be formed in the pixel region 10 and the second region 22 by shifting the mask 310. Specifically, after shifting the mask 310 such that the opening 315 corresponds to the second pixel region 10b and the second region 22, the second capping layer 224 may be formed using the hole transport material line of organic material. For example, the second capping layer 224 may be formed of material substantially the same as that of the first capping layer 222. FIG. 14 illustrates that the mask 310 is shifted along the first direction, but the invention need not be limited thereto. For example, the mask 310 may be shifted along a direction substantially opposite to the first direction.

The same mask 310 may be used in the formation of both the first capping layer 222 and the second capping layer 224, so that the first capping layer 222 and the second capping layer 224 may have substantially the same size areas. In this manner, a capping structure 220 including the first capping layer 222 and the second capping layer 224 may be formed.

In example embodiments, a width of the opening 315 may be substantially equal to the sum of a width of the pixel region 10 and a half of a width of the transmission region 20. Accordingly, the first capping layer 222 and the second capping layer 224 may overlap each other across the entirety of the pixel region 10. An end portion of the first region 21 in which the first capping layer 222 is formed, and an end portion of the second region 22 in which the second capping layer 224 is formed, may be substantially adjacent to each other in the transmission region 20. In other words, in the transmission region 20, the first capping layer 222 and the second capping layer 224 may not overlap and also may not be spaced apart from each other.

In example embodiments, the capping structure 220 may have a first thickness in the pixel region 10, and may have a second thickness less than the first thickness in the transmission region 20. In some embodiments, the first capping layer 222 and the second capping layer 224 may have a substantially the same thickness. Accordingly, the capping structure 220 may have the second thickness in the transmission region 20, and may have the first thickness, which is about twice the second thickness, in the pixel region 10.

As mentioned above, the capping structure 220 having different thickness in the pixel region 10 and the transmission region 20 may be formed by shifting one mask 310, so that manufacturing time and cost of the capping structure 220 may be reduced, and a transparent display device with improved luminescent efficiency and light transmittance may be manufactured.

Figure 15:
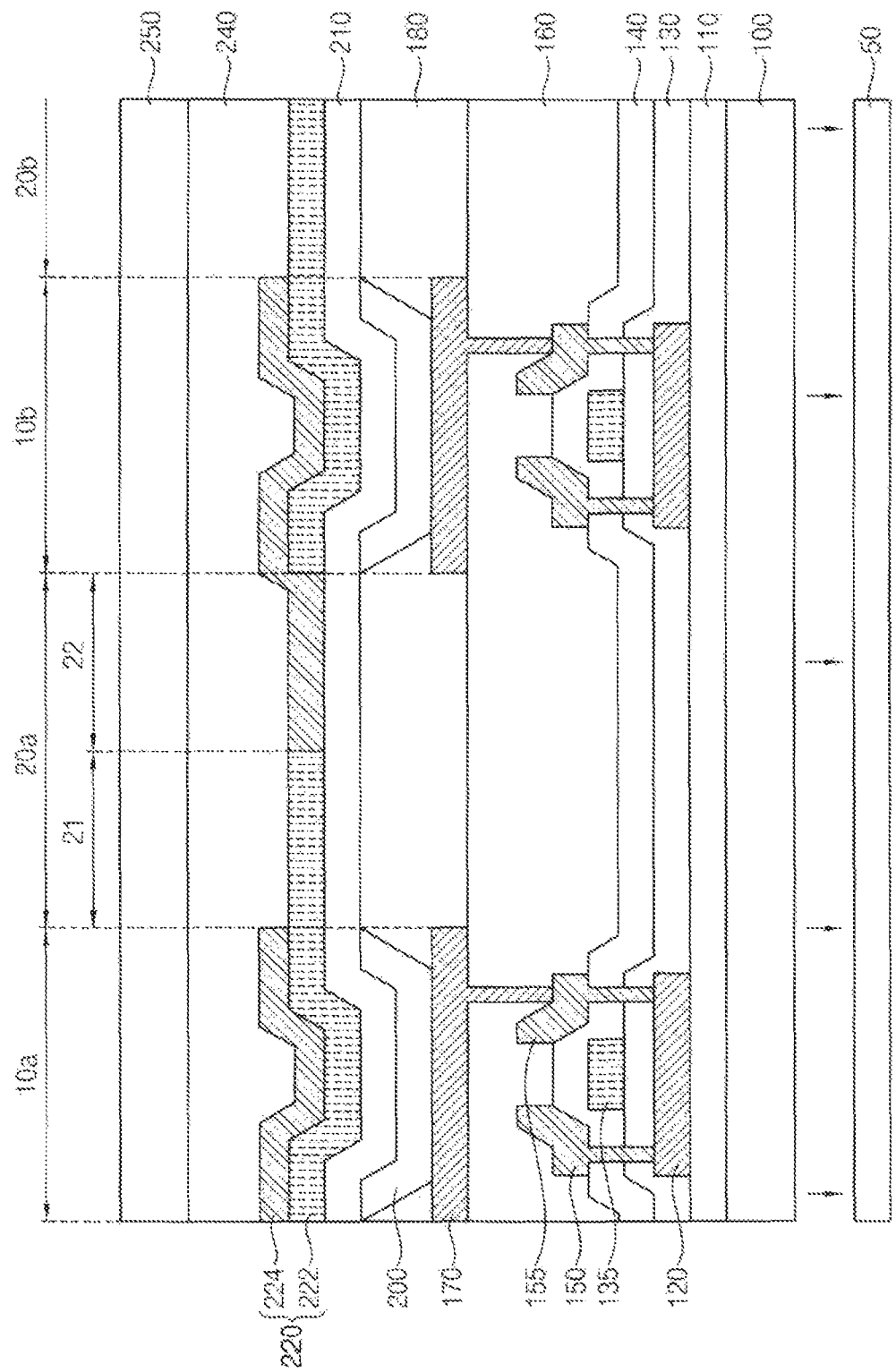

Referring to FIG. 15, a filling layer 240 and an encapsulation substrate 250 may be layered on the capping structure 220. The carrier substrate 50 may also be detached from the substrate 100. For example, when the substrate 100 is a plastic substrate, the carrier substrate 50 may be detached from the substrate 100 by a laser-lifting process or by applying a mechanical tension.

Figure 16:
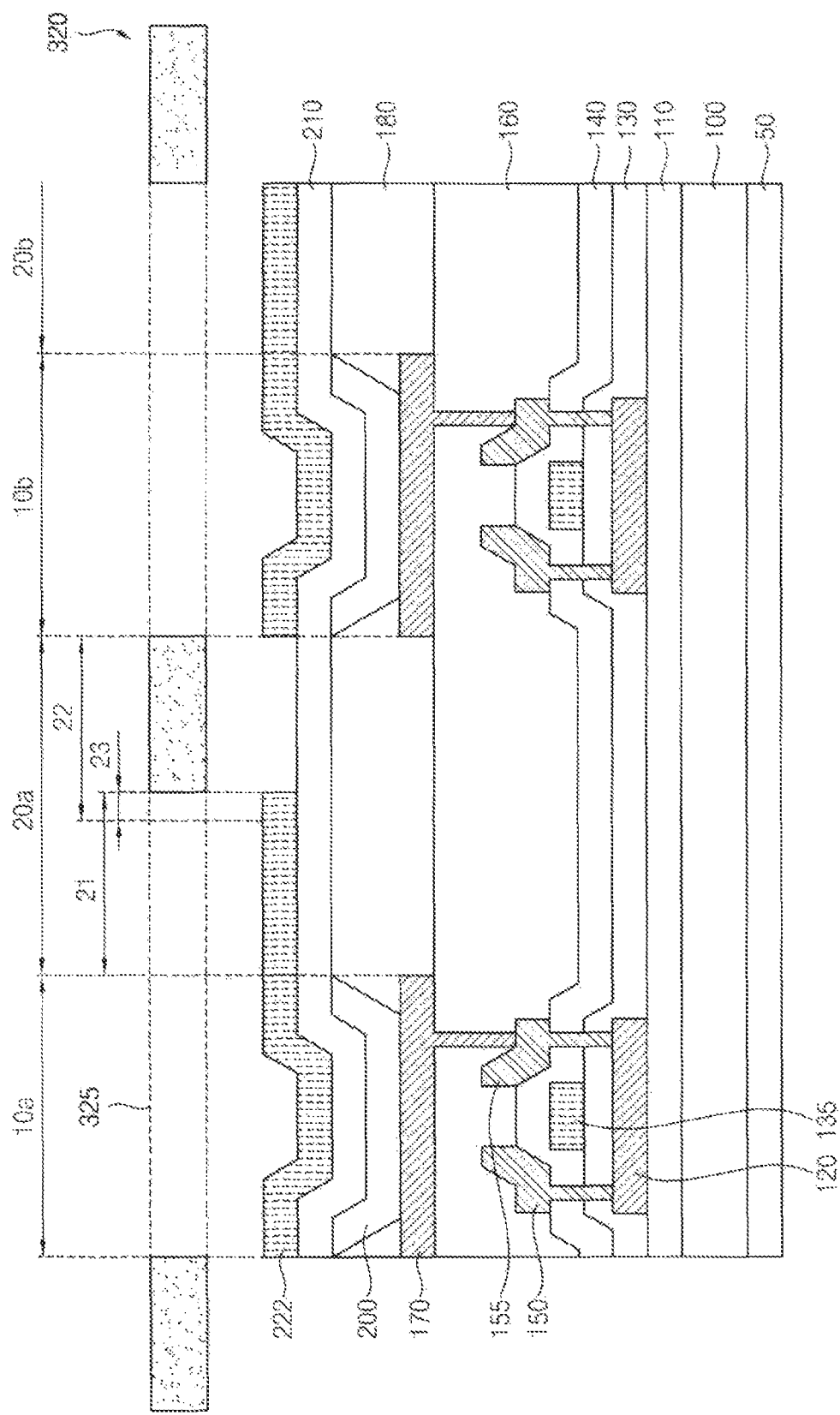
FIGS. 16 and 17 are cross-sectional views illustrating a method of manufacturing a transparent display device in accordance with some example embodiments.
Figure 17:
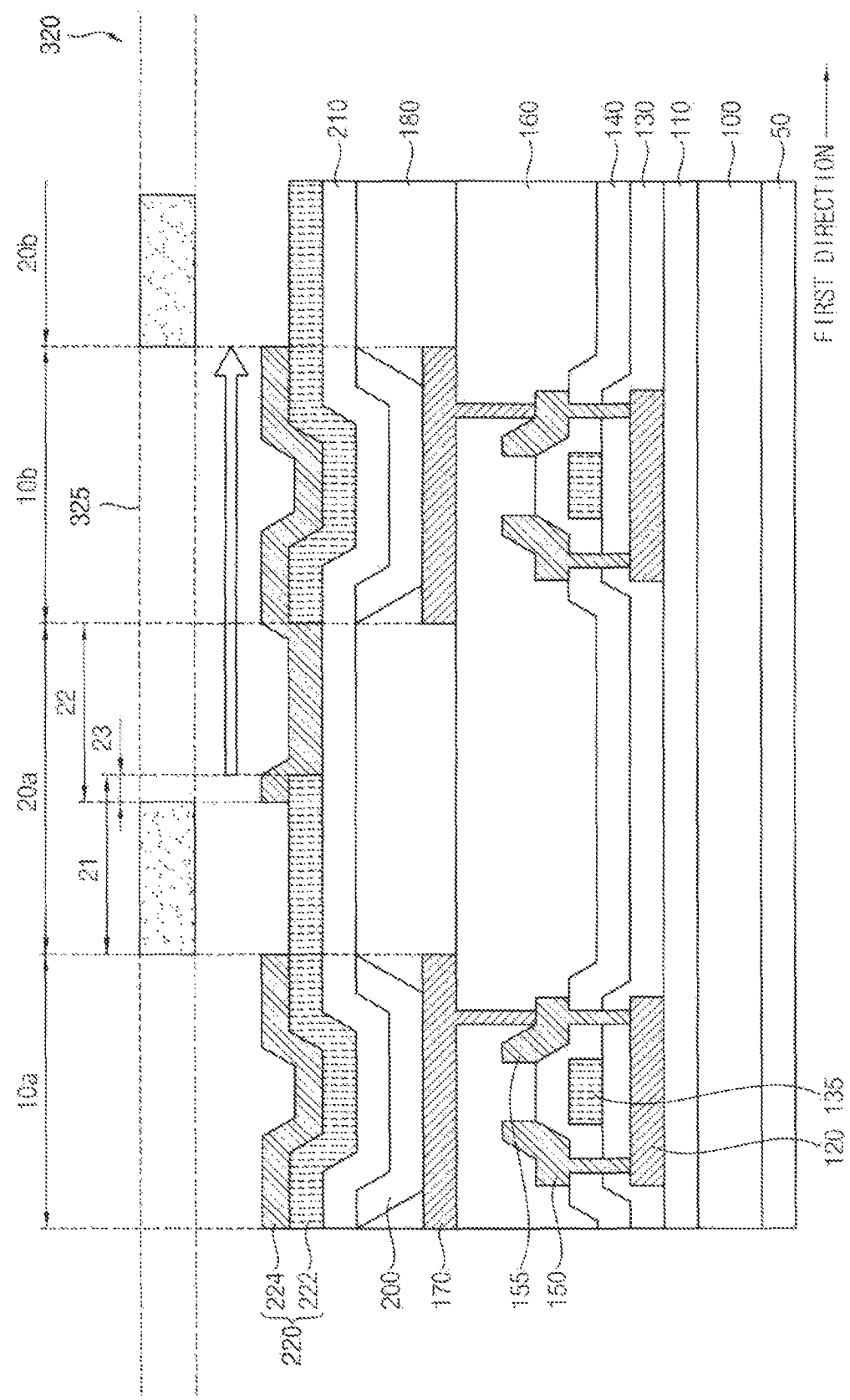

FIGS. 16 and 17 are cross-sectional views illustrating a method of manufacturing a transparent display device in accordance with some example embodiments.

For example, FIGS. 16 and 17 illustrate a method of manufacturing the transparent display device illustrated in FIG. 4. Detailed descriptions of processes and/or elements already described with reference to FIGS. 9 to 15 will be omitted.

Referring to FIGS. 16 and 17, the capping structure 220 may be formed on the second electrode 210.

As illustrated in FIG. 16, the first capping layer 222 may be formed in the pixel region 10 and the first region 21 by using a mask 320 that includes an opening 325. Specifically, after disposing the mask 320 such that the opening 325 corresponds to the first pixel region 10a and the first region 21, the first capping layer 222 may be formed using the hole transport material line of organic material. The mask 320 may be, for example, a fine metal mask (FMM).

Then, as illustrated in FIG. 17, the second capping layer 224 may be formed in the pixel region 10 and the second region 22 by shifting the mask 320. Specifically, after shifting the mask 320 such that the opening 325 corresponds to the second pixel region 10b and the second region 22, the second capping layer 224 may be formed using the hole transport material line of organic material. For example, the second capping layer 224 may be formed of material substantially the same as that of the first capping layer 222. FIG. 17 illustrates that the mask 320 is shifted along the first direction, but the invention need not be limited thereto. For example, the mask 320 may be shifted along a direction substantially opposite to the first direction.

The same mask 320 may be used for the formation of the first capping layer 222 and the second capping layer 224, so that the first capping layer 222 and the second capping layer 224 may have substantially the same size areas. In this manner, the capping structure 220 including the first capping layer 222 and the second capping layer 224 may be formed.

In example embodiments, a width of the opening 325 may be substantially greater than the sum of a width of the pixel region 10 and a half of a width of the transmission region 20. Accordingly, the first capping layer 222 and the second capping layer 244 may overlap each other throughout the entirety of the pixel region 10. Additionally, the first capping layer 222 and the second capping layer 224 may overlap in at least a portion of the transmission region 20. In other words, the transmission region 20 may further include a third region 23 in which the first capping layer 222 and the second capping layer 224 overlap each other.

In example embodiments, the capping structure 220 may have a first thickness in the pixel region 10, may have the first thickness in the third region 23, and may have a second thickness less than the first thickness in the rest of transmission region 20 outside the third region 23. In some embodiments, the first capping layer 222 and the second capping layer 224 may have substantially the same thickness. Accordingly, the capping structure 220 may have the second thickness in that portion of transmission region 20 outside the third region 23, and may have the first thickness about twice of the second thickness in the pixel region 10 and the third region 23. Here, light transmittance in the third region 23 may be reduced when the third region 23 has the first thickness. However, an area of the third region 23 in the transmission region 20 may be minimized, so that reduction of light transmittance in the transmission region 20 may be prevented or minimized.

Figure 18:
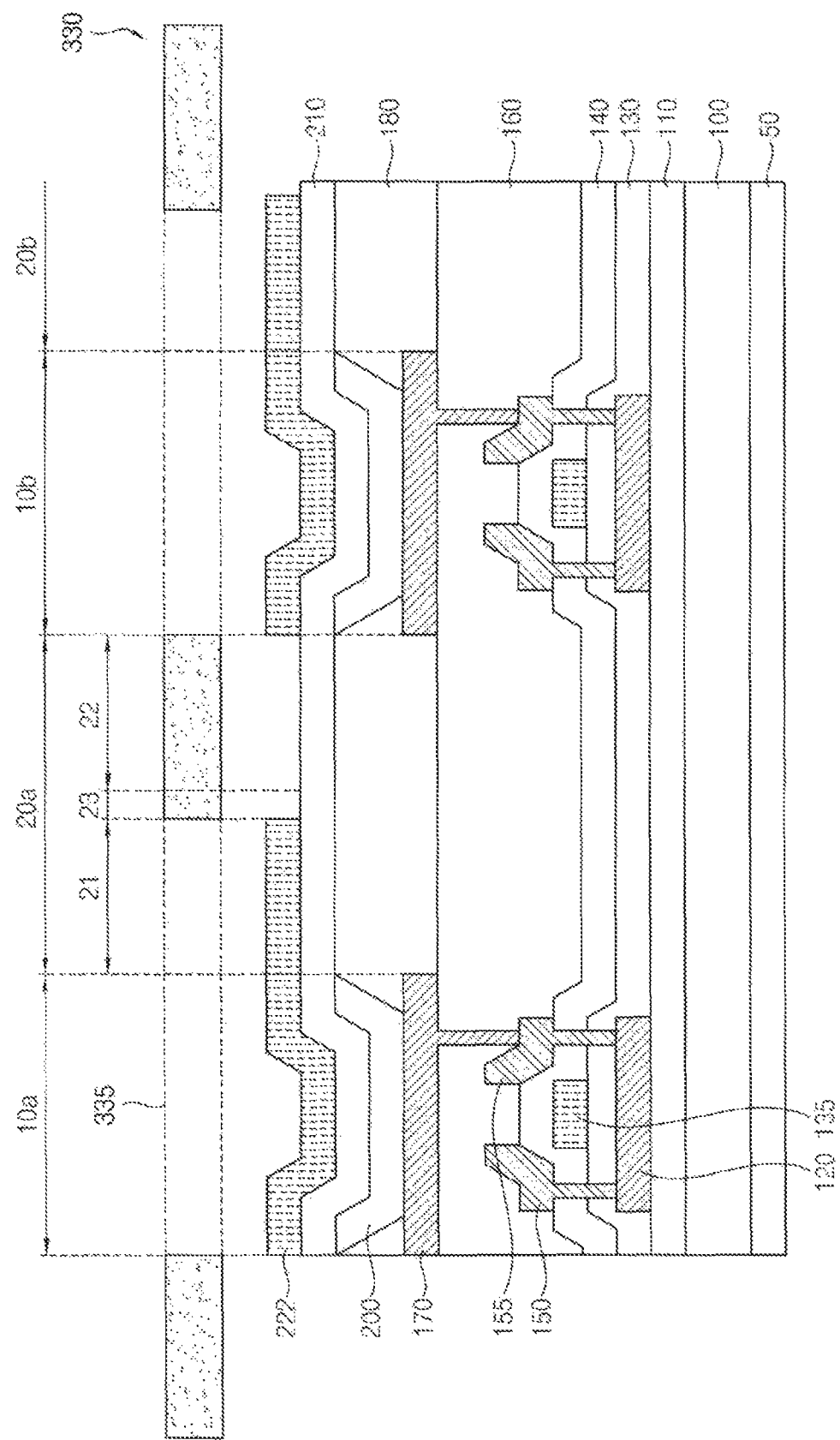
FIGS. 18 and 19 are cross-sectional views illustrating a method of manufacturing a transparent display device in accordance with some example embodiments.
Figure 19:
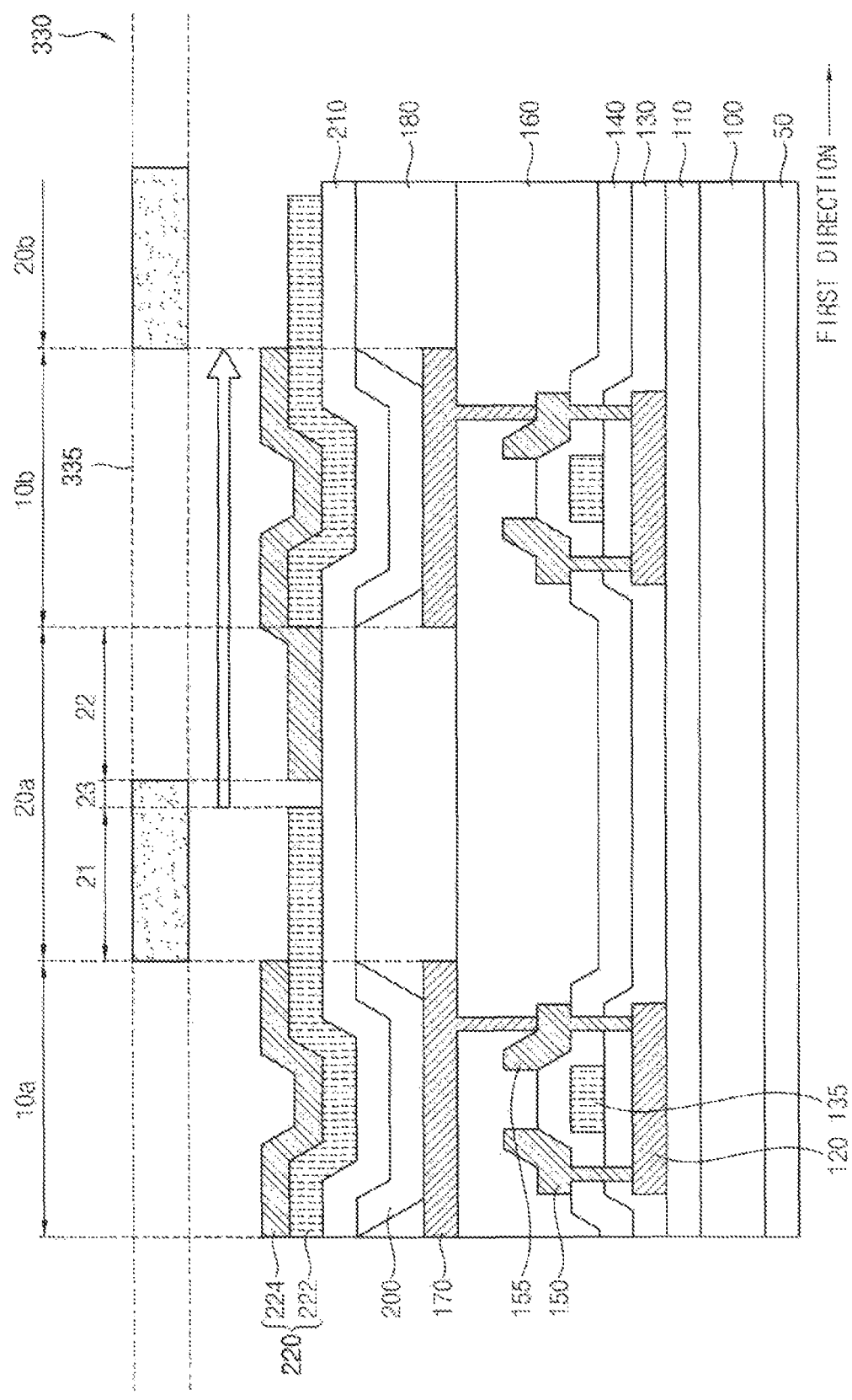

FIGS. 18 and 19 are cross-sectional views illustrating a method of manufacturing a transparent display device in accordance with some example embodiments.

For example, FIGS. 18 and 19 illustrate a method of manufacturing the transparent display device illustrated in FIG. 5. Detailed descriptions of processes and/or elements already described with reference to FIGS. 9 to 15, and FIGS. 16 and 17 will be omitted.

Referring to FIGS. 18 and 19, the capping structure 220 may be formed on the second electrode 210.

As illustrated in FIG. 18, the first capping layer 222 may be formed in the pixel region 10 and the first region 21 by using a mask 330 that includes an opening 335. Specifically, after disposing the mask 330 such that the opening 335 corresponds to the first pixel region 10a and the first region 21, the first capping layer 222 may be formed using the hole transport material line of organic material. The mask 330 may be, for instance, a fine metal mask (FMM).

Then, as illustrated in FIG. 19, the second capping layer 224 may be formed in the pixel region 10 and the second region 22 by shifting the mask 330. Specifically, after shifting the mask 330 such that the opening 335 corresponds to the second pixel region 10b and the second region 22, the second capping layer 224 may be formed using the hole transport material line of organic material. For example, the second capping layer 224 may be formed of material substantially the same as that of the first capping layer 222. FIG. 19 illustrates that the mask 330 is shifted along the first direction, but the invention need not be limited thereto. For example, the mask 330 may instead be shifted along a direction substantially opposite to the first direction.

The same mask 330 may be used for the formation of the first capping layer 222 and the second capping layer 224, so that the first capping layer 222 and the second capping layer 224 may have substantially the same size areas. In this manner, a capping structure 220 including the first capping layer 222 and the second capping layer 224 may be formed.

In example embodiments, a width of the opening 335 may be substantially greater than a width of the pixel region 10, and may be substantially less than a sum of the width of the pixel region 10 and half of a width of the transmission region 20. Accordingly, the first capping layer 222 and the second capping layer 244 may overlap across an entirety of the pixel region 10. Additionally, the first capping layer 222 and the second capping layer 224 may not be formed in, or absent from, at least a portion of the transmission region 20. In other words, the transmission region 20 may further include a third region 23 between the first region 21 and the second region 22, in which the first capping layer 222 and the second capping layer 224 are both absent.

In example embodiments, the capping structure 220 may have a first thickness in the pixel region 10, and may have a second thickness less than the first thickness in the first region 21 and the second region 22. Additionally, an opening defined by a sidewall of the first capping layer 222, a sidewall of the second capping layer 224, and an exposed top surface of the second electrode 210 may be formed. In some embodiments, the first capping layer 222 and the second capping layer 224 may have substantially the same thickness. Accordingly, the capping structure 220 may have the second thickness in the first region 21 and the second region 22, and may have the first thickness, which is about twice the second thickness, in the pixel region 10. Here, light transmittance in the third region 23 may be reduced when the opening is formed in the third region 23. However, an area of the third region 23 in the transmission region 20 may be minimized, so that reduction of light transmittance in the transmission region 20 may be prevented or minimized.

Figure 20:
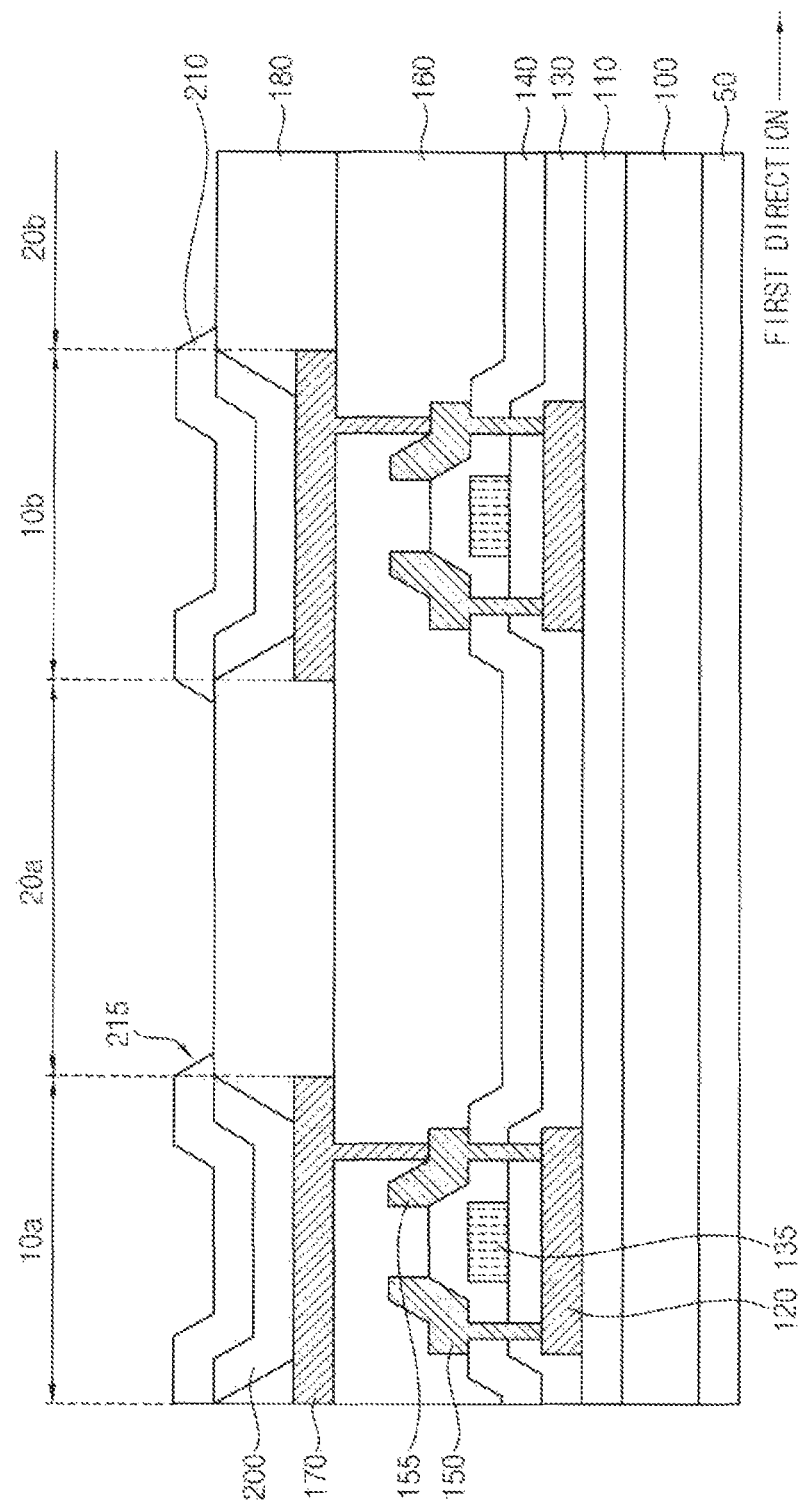
FIG. 20 is a cross-sectional view illustrating a method of manufacturing a transparent display device in accordance with some example embodiments.

FIG. 20 is a cross-sectional view illustrating a method of manufacturing a transparent display device in accordance with some example embodiments.

In particular, FIG. 20 illustrates a method of manufacturing the transparent display device illustrated in FIG. 6. Detailed descriptions on processes and/or elements already described with reference to FIGS. 9 to 15 will be omitted.

Referring to FIG. 20, an aperture 215 overlapping at least a portion of the transmission region 20 may be formed in the second electrode 210. As illustrated in FIG. 12, a portion of the second electrode 210 is removed from the transmission region 20 to form the aperture 215. As an aperture 215 is formed in the second electrode 210, a light transmittance in the transmission region 20 may be improved.

In some example embodiments, the aperture 215 may substantially cover the entirety of the transmission region 20. In this case, as an area of the aperture 215 increases, the light transmittance in the transmission region 20 may be further improved.

Figure 21:
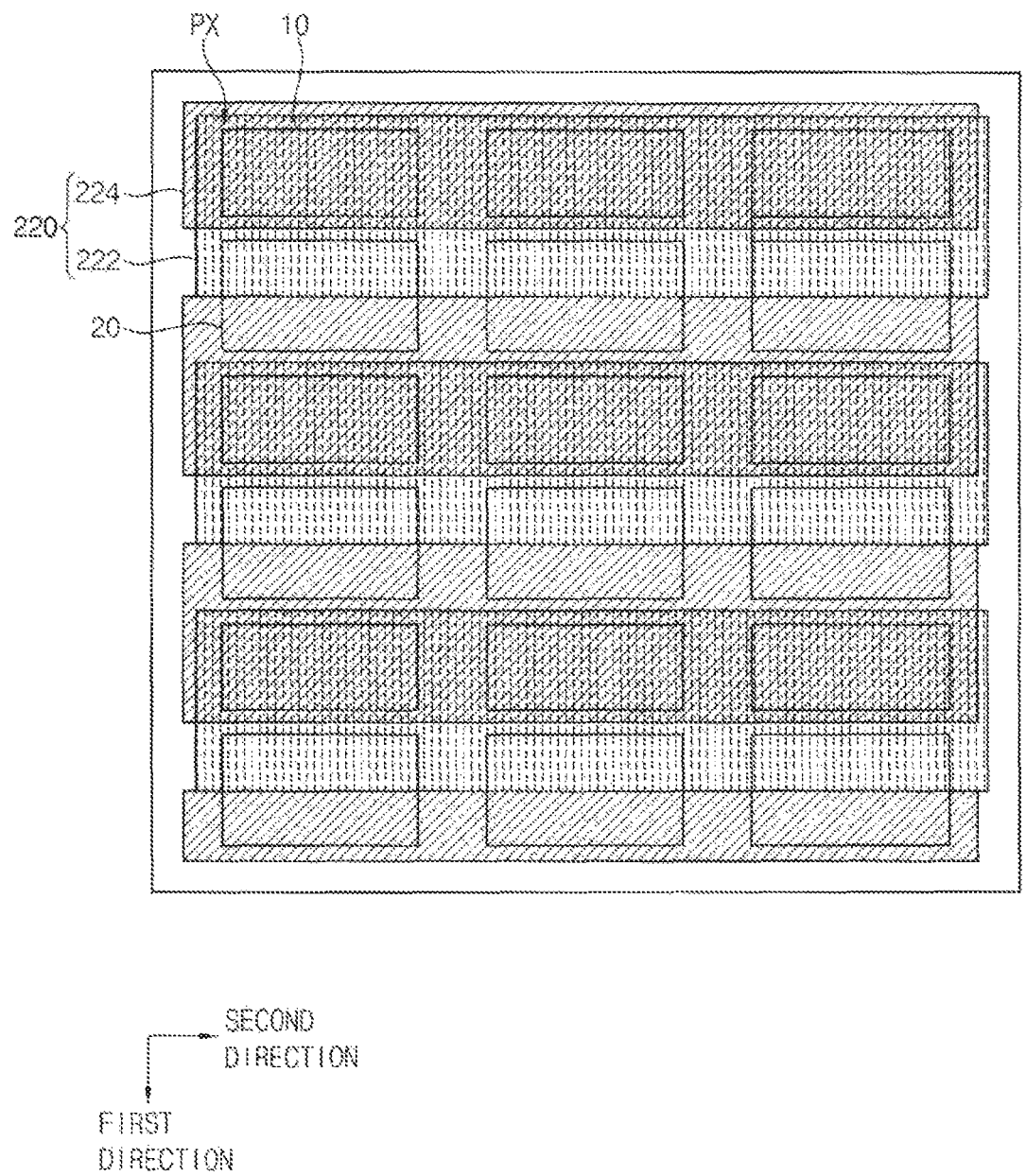
FIG. 21 is a plan view illustrating a transparent display device in accordance with example embodiments.
Figure 22:
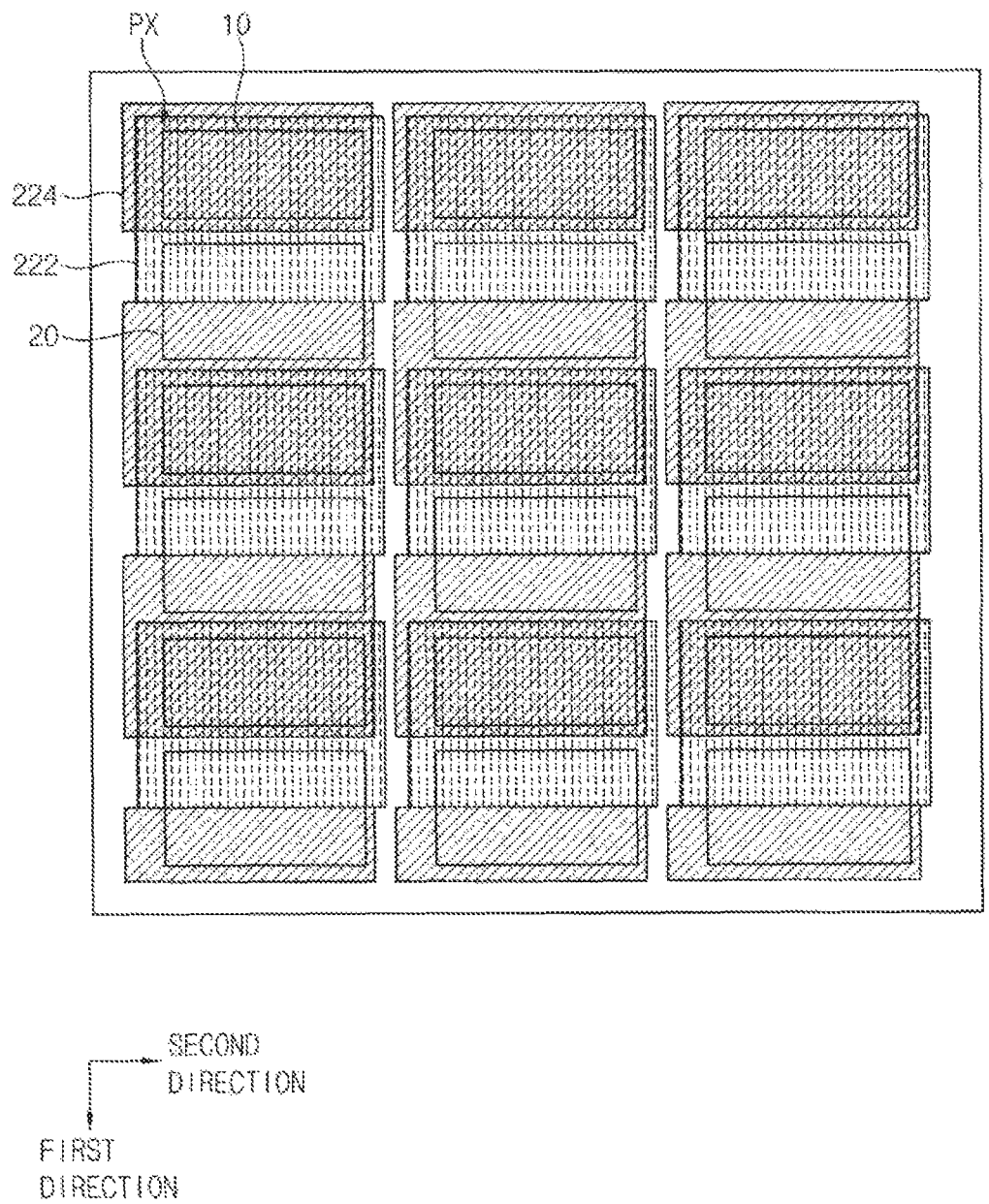
FIG. 22 is a plan view illustrating a transparent display device in accordance with some example embodiments.

FIG. 21 is a plan view illustrating a transparent display device in accordance with example embodiments. FIG. 22 is a plan view illustrating a transparent display device in accordance with some example embodiments.

For example, FIGS. 21 and 22 illustrate a transparent display device as described in FIG. 3. However, the invention may be not limited thereto, and FIGS. 21 and 22 may be applied to other transparent display devices such as those illustrated in FIGS. 4 to 8.

Referring to FIGS. 21 and 22, the transparent display device may include a plurality of unit pixels PX. The unit pixels PX may be arranged along the first direction and the second direction, which as shown are substantially perpendicular to each other. For example, N pixel rows may be arranged along the first direction, and M pixel columns may be arranged along the second direction in the transparent display device. Here, each of N and M may be a positive integer. Each of the unit pixels PX may include a pixel region 10 and a transmission region 20.

The capping structure 220 may cover the pixel region 10 and the transmission region 20. The capping structure 220 may include the first capping layer 222 and the second capping layer 224. In example embodiments, the first capping layer 222 may cover the pixel region 10 of a k-th pixel row, and a transmission region 20 adjacent thereto. The second capping layer 224 may cover the pixel region 10 of a (k+1)-th pixel row and part of the transmission region 20 of the k-th pixel row. Here, k may be a positive integer between 1 through N−1.

In some example embodiments, as illustrated in FIG. 21, the capping structure 220 may be commonly disposed on multiple unit pixels PX arranged along the second direction. In this case, each of the first capping layer 222 and the second capping layer 224 may have a stripe shape.

In some example embodiments, as illustrated in FIG. 22, the capping structure 220 may be individually disposed on each of the unit pixels PX arranged along the second direction. In this case, each of the first capping layer 222 and the second capping layer 224 may have an island shape.

Figure 23:
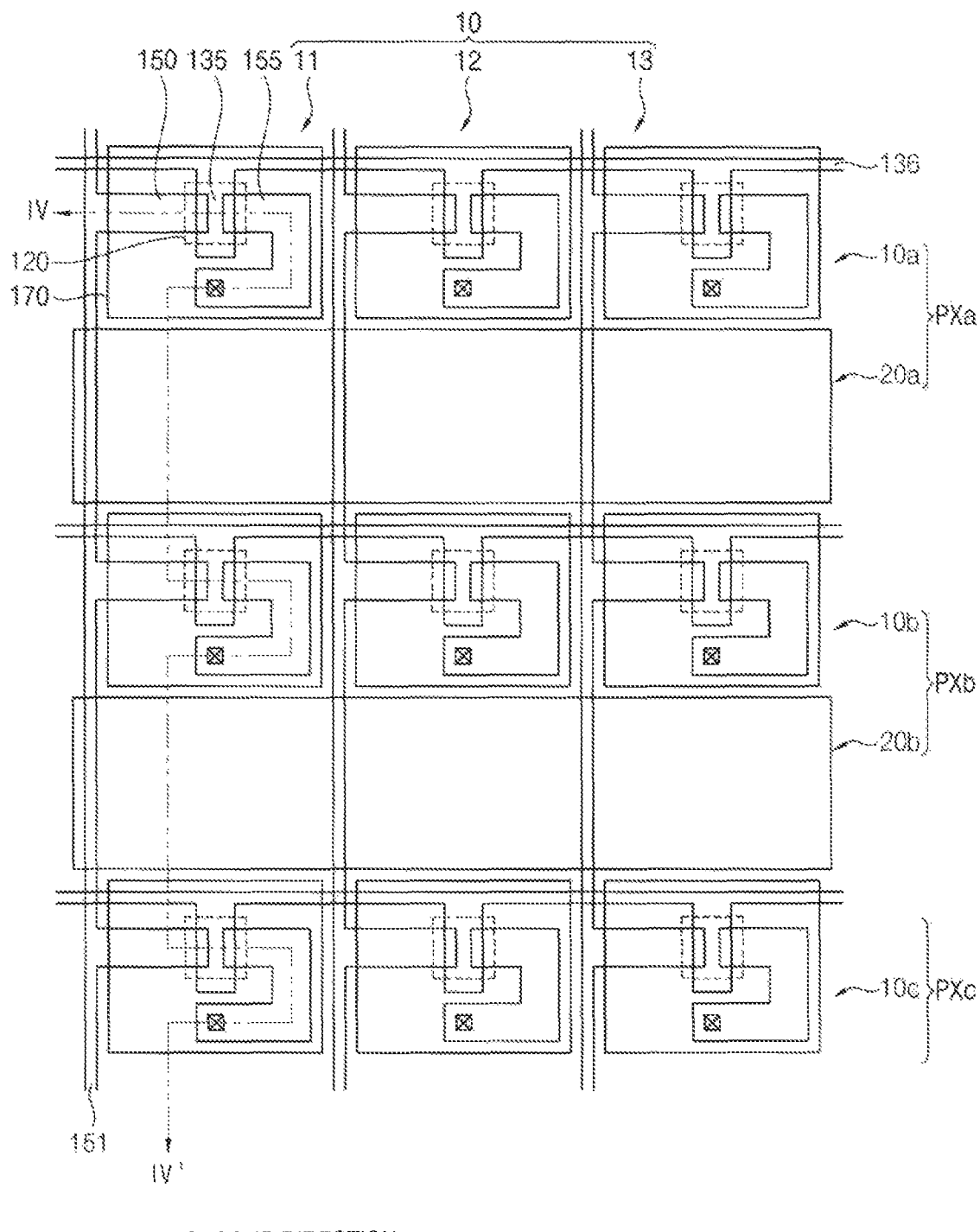
FIG. 23 is a plan view illustrating further details of an area II of the transparent display device in FIG. 1.
Figure 24:
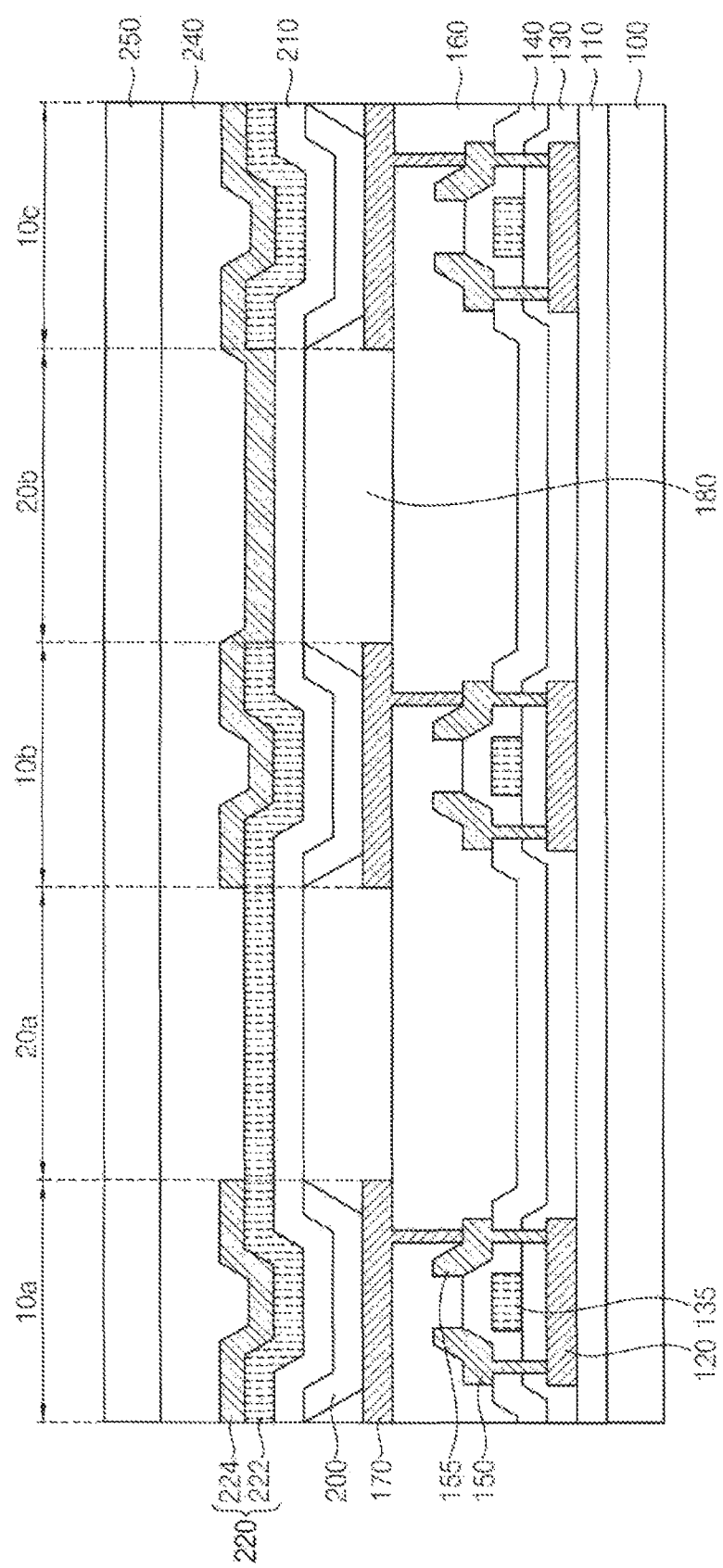
FIG. 24 is a cross-sectional view illustrating a transparent display device in accordance with example embodiments.
Figure 25:
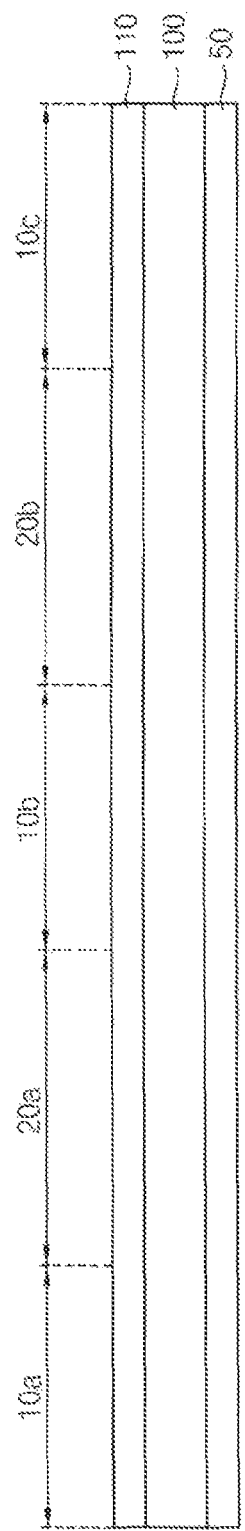
FIGS. 25 to 31 are cross-sectional views illustrating a method of manufacturing a transparent display device in accordance with example embodiments.
Figure 26:
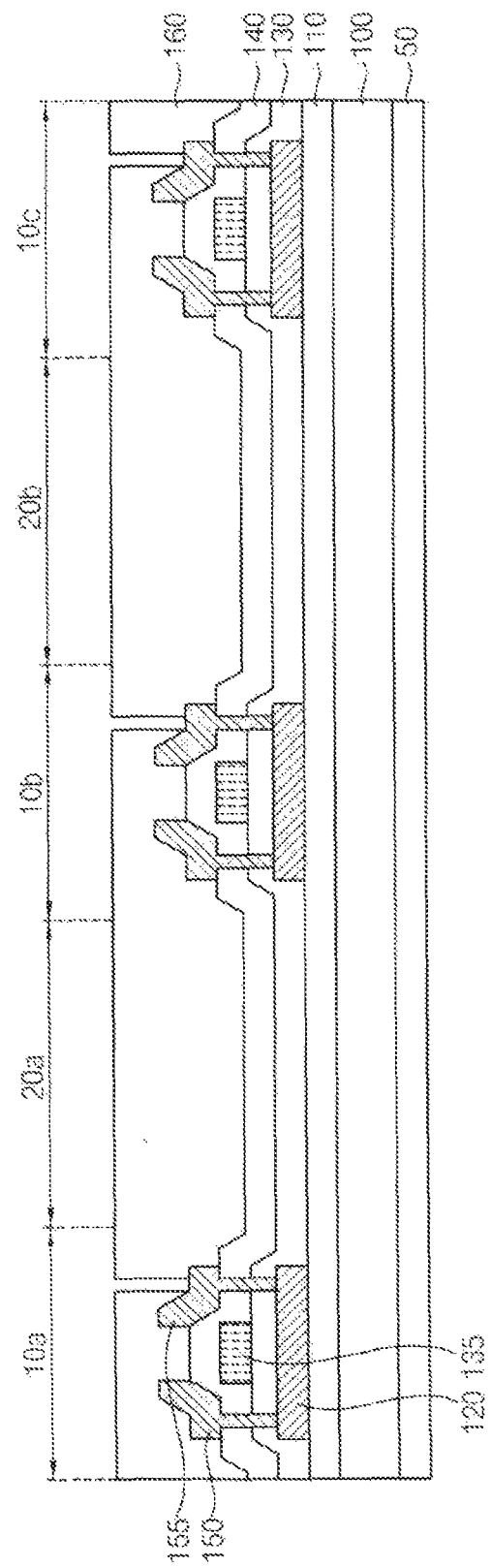
Figure 27:
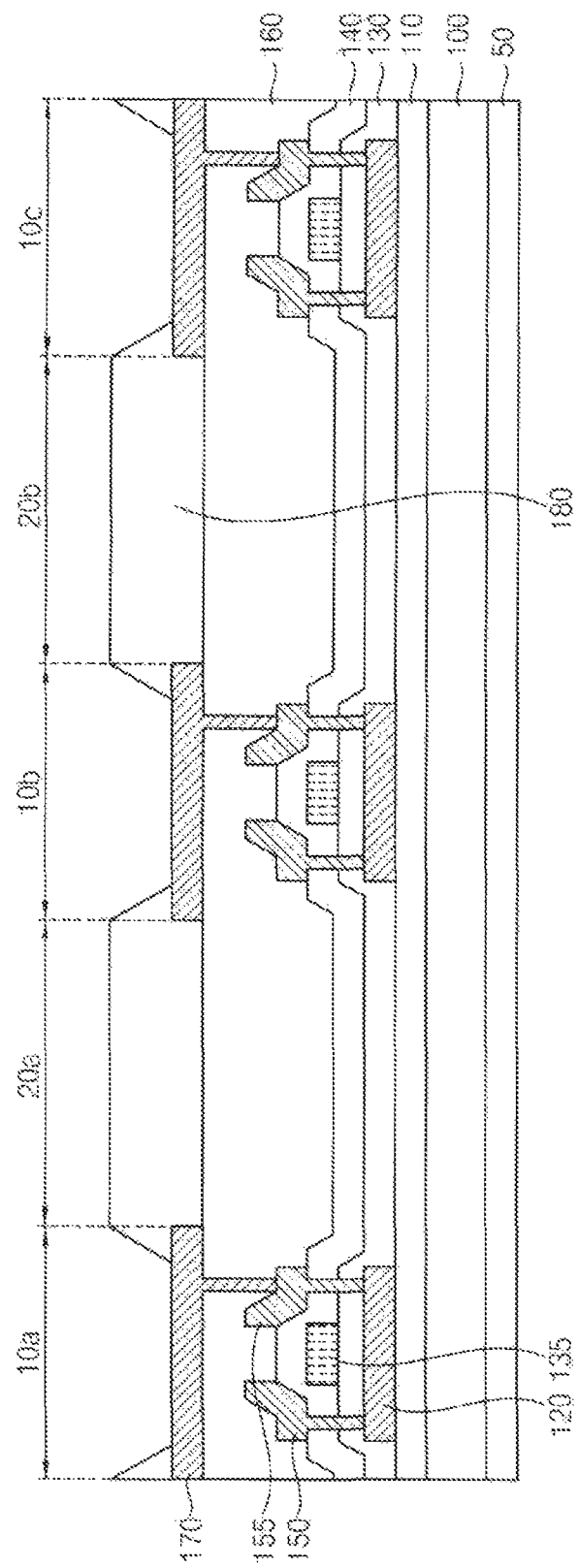
Figure 28:
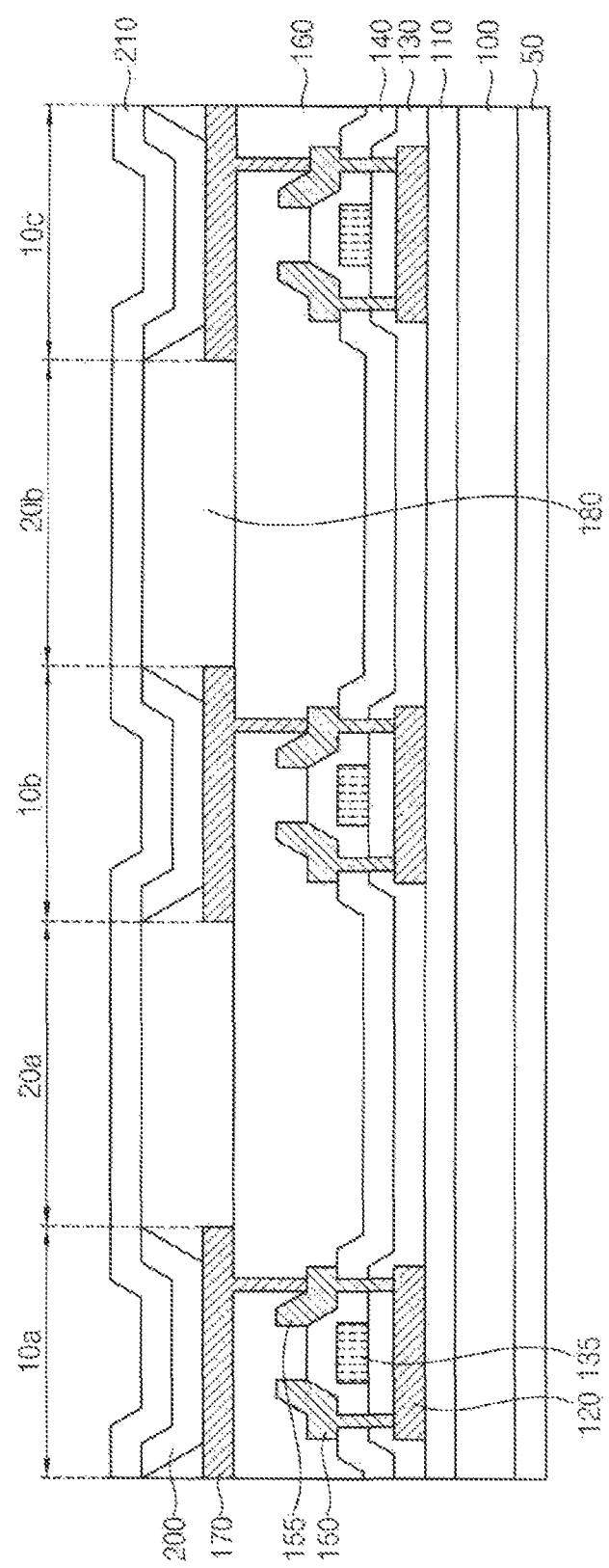

FIG. 23 is a plan view illustrating an area II of the transparent display device in FIG. 1. FIG. 24 is a cross-sectional view illustrating a transparent display device in accordance with example embodiments. For example, FIG. 24 is a cross-sectional view cut along a line IV-IV' in FIG. 23.

The transparent display device illustrated in FIG. 24 may have elements and/or constructions substantially the same as or similar to the transparent display device illustrated in FIGS. 3 to 5, except for constructions of the first capping layer 222 and the second capping layer 224. Therefore, detailed descriptions of repeated elements and/or constructions are omitted, and like reference numerals are used to designate like elements.

Referring to FIGS. 1, 23, and 24, the transparent display device may include a pixel region 10 and a transmission region 20. FIG. 24 illustrates a first pixel region 10a and a first transmission region 20a included in a first unit pixel PXa, a second pixel region 10b and a second transmission region 20b included in a second unit pixel PXb, and a third pixel region 10c included in a third unit pixel PXc. However, unless otherwise specified, the first pixel region 10a, the second pixel region 10b, and the third pixel region 10c will be referred as the pixel region 10 and the first transmission region 20a and the second transmission region 20b will be referred as the transmission region 20, since the first unit pixel PXa, the second unit pixel PXb, and the third unit pixel PXc are substantially the same.

A capping structure 220 may be disposed on the second electrode 210. In example embodiments, the capping structure 220 may substantially cover a top surface of the second electrode 210, and may be provided commonly across both the pixel region 10 and the transmission region 20.

The capping structure 220 may include a first capping layer 222 and a second capping layer 224. The first capping layer 222 may be disposed on the second electrode 210 in the first pixel region 10a, the first transmission region 20a, and the second pixel region 10b. In example embodiments, the first capping layer 222 may cover the top surface of the second electrode 210, and may be provided commonly across each of the first pixel region 10a, the first transmission region 20a, and the second pixel region 10b. For example, the first transmission region 20a may be disposed between the first pixel region 10a and the second pixel region 10b.

The second capping layer 224 may be disposed on the second electrode 210 in the first pixel region 10a, the second pixel region 10b, and the second transmission region 20b. In example embodiments, the second capping layer 224 may cover the top surface of the second electrode 210, and may be provided commonly across each of the first pixel region 10a, the second pixel region 10b, and the second transmission region 20b. For example, the second transmission region 20b may be disposed between the second pixel region 10b and the third pixel region 10c.

In example embodiments, the capping structure 220 may have a first thickness in the pixel region 10, and may have a second thickness less than the first thickness in the transmission region 20. For example, the first thickness may be substantially equal to the sum of a thickness of the first capping layer 222 and a thickness of the second capping layer 224, and the second thickness may be substantially equal to just the thickness of the first capping layer 222 or the thickness of the second capping layer 224.

In example embodiments, the first capping layer 222 and the second capping layer 224 may have substantially the same thickness. In this case, the capping structure 220 may have a substantially uniform thickness throughout in the first transmission region 20a and the second transmission region 20b.

Each of the first capping layer 222 and the second capping layer 224 may include an organic material having an improved transmissive property. In some embodiments, each of the first capping layer 222 and the second capping layer 224 may include a material substantially the same as or similar to the hole transport material. Thus, a light emitting property in the pixel region 10 may not be disturbed by the second electrode 210 serving as the cathode.

In example embodiments, the thickness of the first capping layer 222 and the thickness of the second capping layer 224 may be determined in consideration of improving or maximizing luminescent efficiency in the pixel region 10 and improving or maximizing light transmittance in the transmission region 20.

As mentioned above, when the capping structure 220 has the first thickness substantially equal to the sum of the thickness of the first capping layer 222 and the thickness of the second capping layer 224 in the pixel region 10, and has the second thickness substantially equal to the thickness of the first capping layer 222 or the thickness of the second capping layer 224 in the transmission region 20, the luminescent efficiency in the pixel region 10 as well as the light transmittance in the transmission region 20 may be improved.

FIGS. 25 to 31 are cross-sectional views illustrating a method of manufacturing a transparent display device in accordance with example embodiments.

As an example, FIGS. 25 to 31 illustrate a method of manufacturing the transparent display device illustrated in FIG. 24. Detailed descriptions on processes and/or elements previously described with reference to FIGS. 9 to 15, FIGS. 16 and 17, and FIGS. 18 and 19 will be omitted.

Referring to FIGS. 25 to 28, processes substantially the same as or similar to the processes explained in reference with FIGS. 9 to 12 may be performed. Accordingly, a substrate 100 and a buffer layer 110 may be formed on a carrier substrate 50, and a transistor including an active pattern 120, a gate insulation layer 130, a gate electrode 135, an insulation interlayer 140, a source electrode 150, a drain electrode 155, and a via insulation layer 160 covering the transistor may be formed. A first electrode 170 and a pixel defining layer 180 may be formed, and a display layer 200 and a second electrode 210 may be formed.

Figure 29:
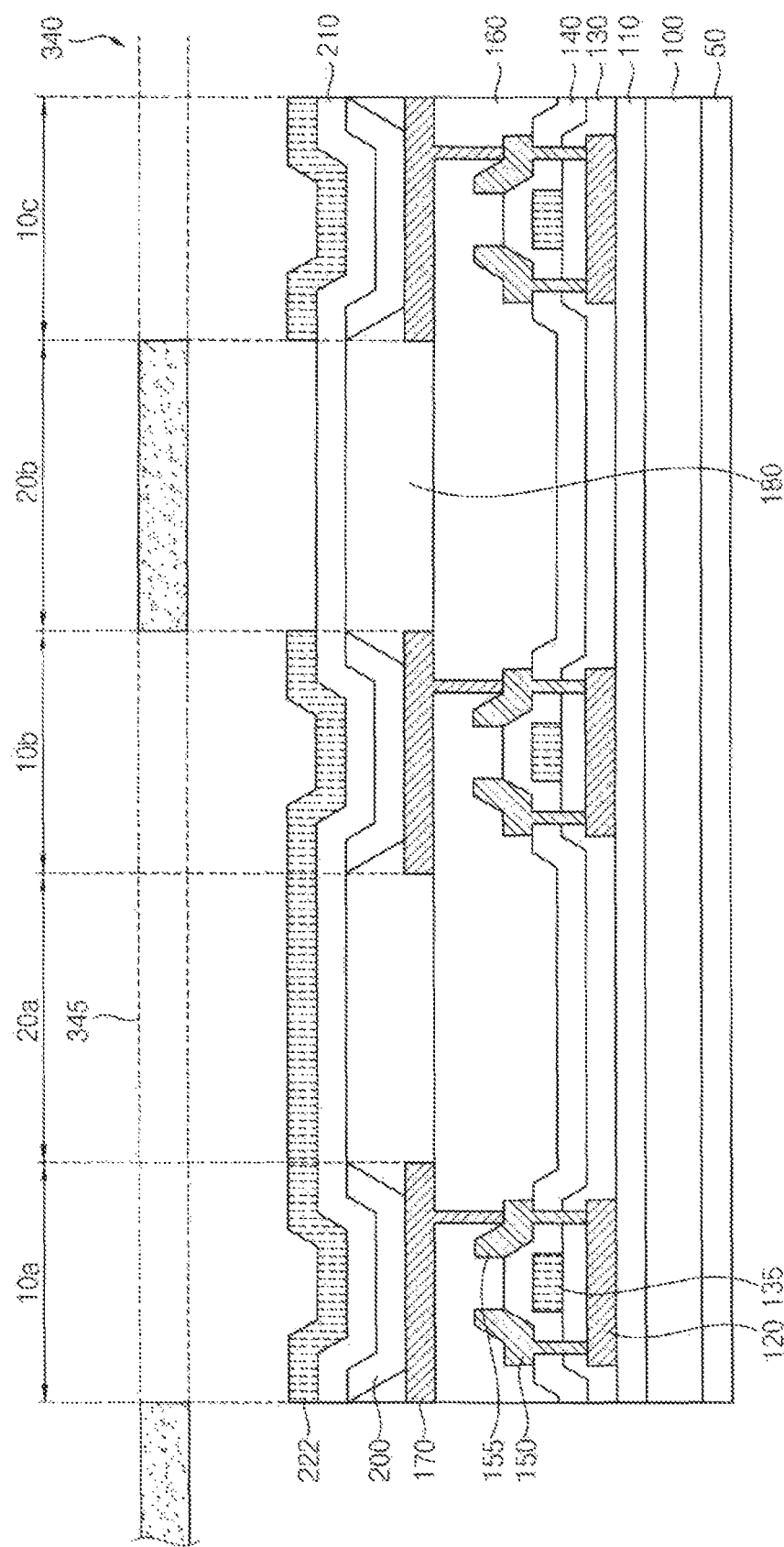
Figure 30:
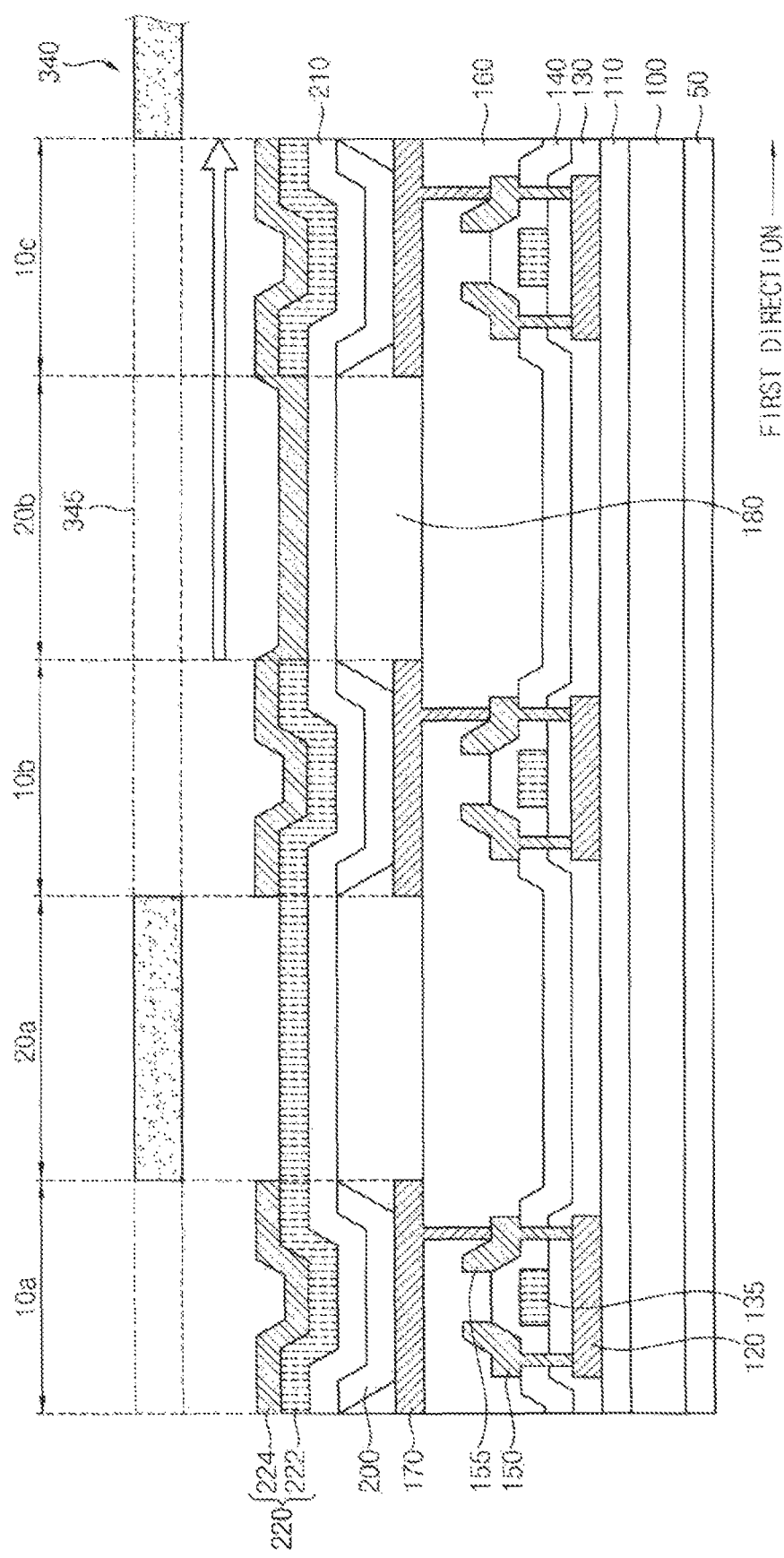

Referring to FIGS. 29 and 30, a capping structure 220 may be formed on the second electrode 210. The capping structure 220 may include a first capping layer 222 and a second capping layer 224.

The first capping layer 222 may be formed on the second electrode 210 in the first pixel region 10a, the first transmission region 20a, and the second pixel region 10b. The second capping layer 224 may be formed on the second electrode 210 in the first pixel region 10a, the second pixel region 10b, and the second transmission region 20b. The first transmission region 20a may be disposed between the first pixel region 10a and the second pixel region 10b, and the second transmission region 20b may be disposed between the second pixel region 10b and the third pixel region 10c.

As illustrated in FIG. 29, the first capping layer 222 may be formed in the first pixel region 10a, the first transmission region 20a, and the second pixel region 10b by using a mask 340 that includes an opening 345. Specifically, after disposing the mask 340 such that the opening 345 corresponds to the first pixel region 10a, the first transmission region 20a, and the second pixel region 10b, the first capping layer 222 may be formed using the hole transport material line of organic material. As one example, the mask 340 may be a fine metal mask (FMM).

Then, as illustrated in FIG. 30, the second capping layer 224 may be formed in the second pixel region 10b, the second transmission region 20b, and the third pixel region 10c by shifting the mask 340. Specifically, after shifting the mask 340 such that the opening 345 corresponds to the second pixel region 10b, the second transmission region 20b, and the third pixel region 10c, the second capping layer 224 may be formed using the hole transport material line of organic material. For example, the second capping layer 224 may be formed of material substantially the same as that of the first capping layer 222. FIG. 30 illustrates that the mask 340 is shifted along the first direction, but the invention is not limited thereto. For example, the mask 340 may be shifted along a direction substantially opposite to the first direction.

The same mask 340 may be used for the formation of the first capping layer 222 and the second capping layer 224, so that the first capping layer 222 and the second capping layer 224 may have substantially the same area sizes. In this manner, a capping structure 220 including the first capping layer 222 and the second capping layer 224 may be formed.

In example embodiments, a width of the opening 345 may be substantially equal to the sum of a width of the first pixel region 10a, a width of the first transmission region 20a, and a width of the second pixel region 10b. In other words, a width of the opening 345 may be substantially the same as the sum of twice a width of the pixel region 10 and a width of the transmission region 20. Accordingly, the first capping layer 222 and the second capping layer 224 may overlap across an entirety of the pixel region 10. Additionally, either the first capping layer 222 or the second capping layer 224 may be formed in the transmission region 20. For example, only the first capping layer 222 may be formed in the first transmission region 20a, and only the second capping layer 224 may be formed in the second transmission region 20b.

In example embodiments, the capping structure 220 may have a first thickness in the first pixel region 10a, the second pixel region 10b, and the third pixel region 10c, and may have a second thickness less than the first thickness in the first transmission region 20a and the second transmission region 20b. In other words, the capping structure 220 may have the first thickness in the pixel region 10, and may have the second thickness in the transmission region 20. In some embodiments, the first capping layer 222 and the second capping layer 224 may have substantially the same thickness. Accordingly, the capping structure 220 may have the second thickness in the transmission region 20, and may have the first thickness, which is about twice of the second thickness, in the pixel region 10.

As mentioned above, a capping structure 220 having different thicknesses in the pixel region 10 and the transmission region 20 may be formed by shifting one mask 340, so that manufacturing time and cost of the capping structure 220 may be reduced, and a transparent display device with improved luminescent efficiency and light transmittance may be manufactured. Additionally, the capping structure 220 with an uniform thickness in the transmission region 20 may be formed.

Figure 31:
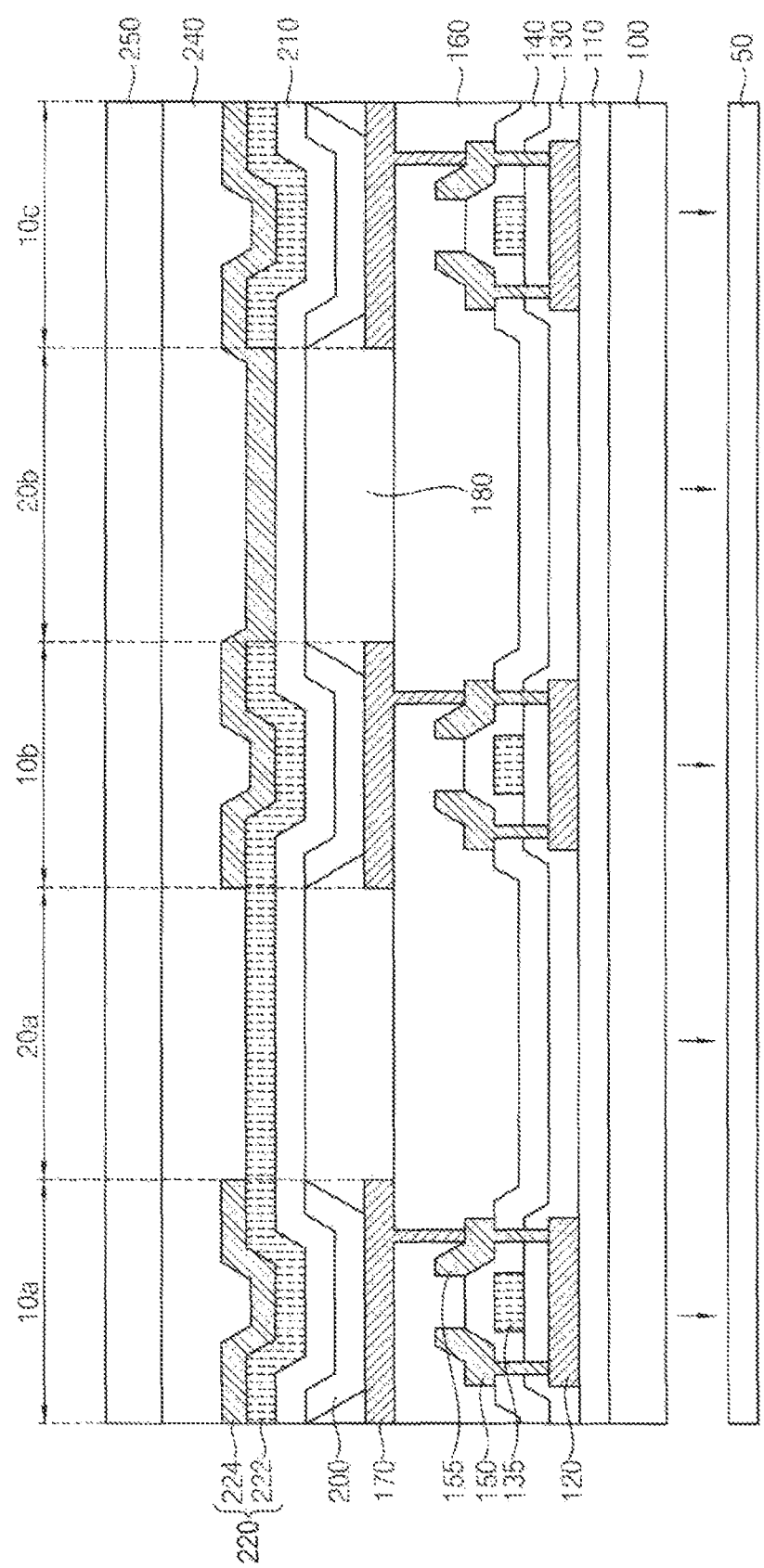

Referring to FIG. 31, processes substantially the same as or similar to the processes explained in reference with FIG. 15 may be performed. More specifically, a filling layer 240 and an encapsulation substrate 250 may be formed on the capping structure 220, and the carrier substrate 50 may be detached from the substrate 100.

Figure 32:
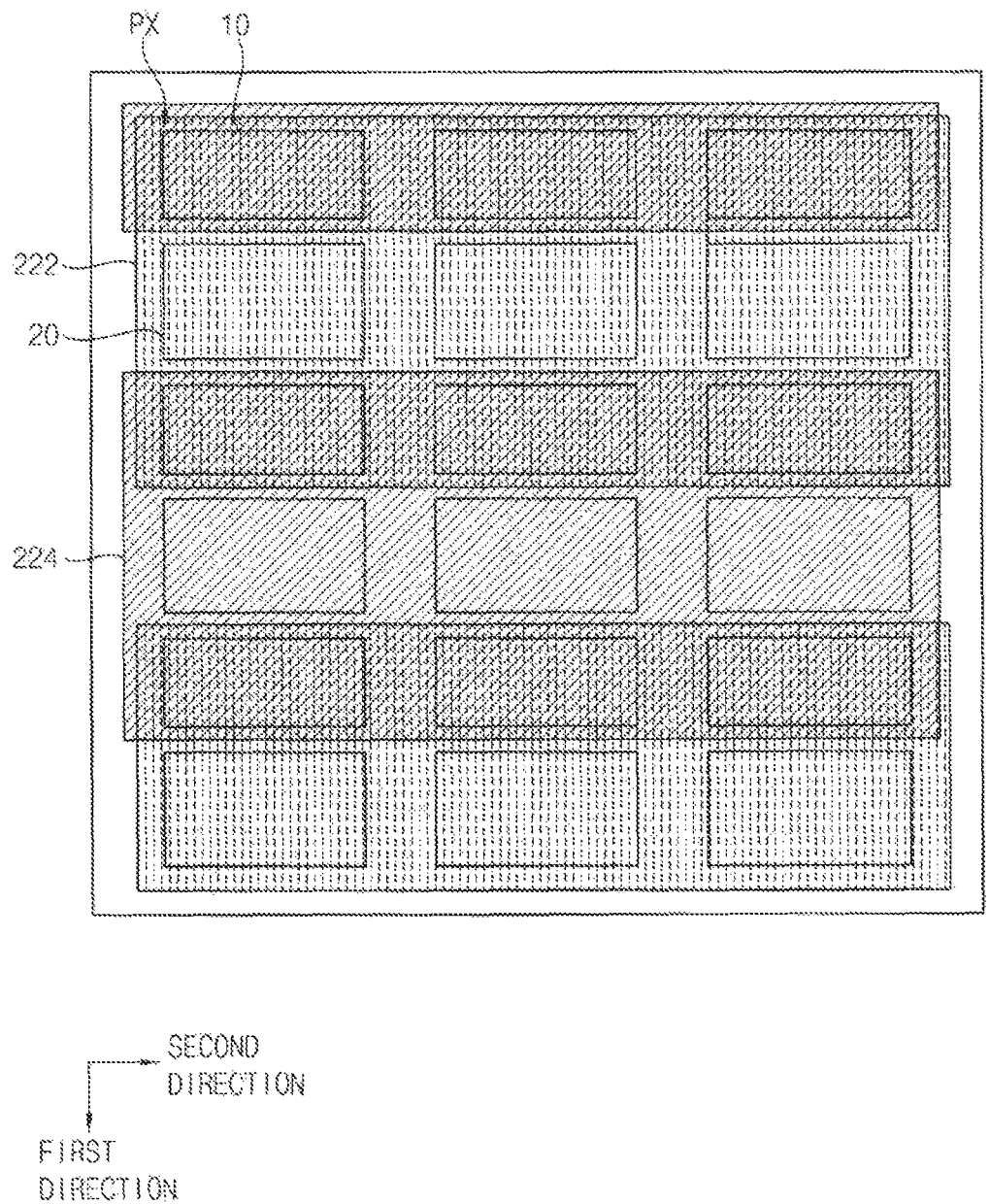
FIG. 32 is a plan view illustrating a transparent display device in accordance with example embodiments.
Figure 33:
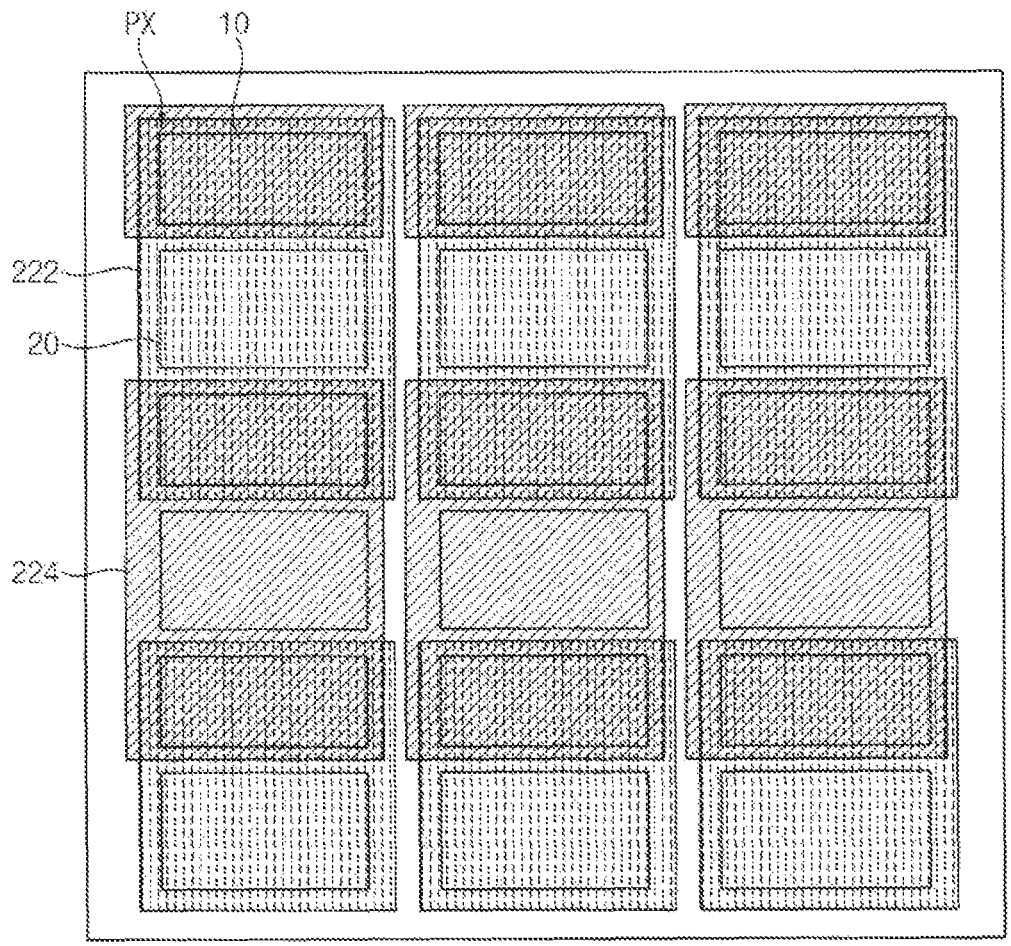
FIG. 33 is a plan view illustrating a transparent display device in accordance with some example embodiments.

FIG. 32 is a plan view illustrating a transparent display device in accordance with example embodiments. FIG. 33 is a plan view illustrating a transparent display device in accordance with some example embodiments. FIGS. 32 and 33 may illustrate, among others, the transparent display device illustrated in FIG. 24.

The transparent display device illustrated in FIGS. 32 and 33 may have elements and/or constructions substantially the same as or similar to the transparent display device illustrated in FIGS. 21 and 22, except for constructions of the first capping layer 222 and the second capping layer 224. Therefore, detailed descriptions of repeated elements and/or constructions are omitted, and like reference numerals are used to designate like elements.

Referring to FIGS. 32 and 33, the capping structure 220 may cover the pixel region 10 and the transmission region 20. The capping structure 220 may include the first capping layer 222 and the second capping layer 224. In example embodiments, the first capping layer 222 may cover the pixel region 10 of a (2k−1)-th pixel row, the transmission region 20 of the (2k−1)-th pixel row, and the pixel region 10 of the (2k)-th pixel row. The second capping layer 224 may cover the pixel region 10 of the (2k)-th pixel row, the transmission region 20 of the (2k)-th pixel row, and the pixel region 10 of a (2k+1)-th pixel row. Here, k may be a positive integer between 1 through (N−1)/2.

In some example embodiments, as illustrated in FIG. 32, the capping structure 220 may be commonly disposed on the unit pixels PX arranged along the second direction. In this case, each of the first capping layer 222 and the second capping layer 224 may have a stripe shape.

In some example embodiments, as illustrated in FIG. 33, the capping structure 220 may be individually disposed per each of the unit pixels PX arranged along the second direction. In this case, each of the first capping layer 222 and the second capping layer 224 may have an island shape.

The transparent display devices according to example embodiments may be applied to various electronic devices such as computers, notebooks, cell phones, smart phones, smart pads, personal media players (PMPs), personal digital assistances (PDAs), MP3 players, or the like, as well as display devices with improved light transmittance such as navigation systems for automobiles, head-up displays, or the like.

Although a few example embodiments have been described, those skilled in the art will readily appreciate that many modifications are possible in the example embodiments without materially departing from the novel teachings and advantages of the present inventive concept. Various features of the above described and other embodiments can thus be mixed and matched in any manner, to produce further embodiments consistent with the invention.

What is claimed is:

1. A transparent display device comprising:
 a substrate including a first pixel region, a first transmission region, a second pixel region, and a second transmission region;
 a first electrode disposed over the substrate in each of the first pixel region and the second pixel region;
 a display layer disposed on the first electrode;
 a second electrode facing the first electrode and disposed on the display layer; and
 a capping structure disposed on the second electrode,
 wherein the capping structure comprises:
  a first capping layer disposed on the second electrode in the first pixel region, the first transmission region, and the second pixel region; and
  a second capping layer disposed on the second electrode in the first pixel region, the second pixel region, and the second transmission region.

2. The transparent display device of claim 1, wherein the capping structure has a first thickness in the first pixel region and the second pixel region, and has a second thickness less than the first thickness in the first transmission region and the second transmission region.

* * * * *